(12) United States Patent
Ohtani

(10) Patent No.: US 11,978,793 B2
(45) Date of Patent: May 7, 2024

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Tokyo (JP)

(72) Inventor: Kinya Ohtani, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 206 days.

(21) Appl. No.: 17/371,054

(22) Filed: Jul. 8, 2021

(65) Prior Publication Data

US 2022/0013664 A1   Jan. 13, 2022

(30) Foreign Application Priority Data

Jul. 9, 2020   (JP) .................................. 2020-118213

(51) Int. Cl.
*H01L 29/78*   (2006.01)
*H01L 29/06*   (2006.01)
(Continued)

(52) U.S. Cl.
CPC ...... *H01L 29/7813* (2013.01); *H01L 29/0634* (2013.01); *H01L 29/407* (2013.01);
(Continued)

(58) Field of Classification Search
CPC ............. H01L 29/7813; H01L 29/0634; H01L 29/407; H01L 29/4236; H01L 29/66734;
(Continued)

(56) References Cited

U.S. PATENT DOCUMENTS 6,429,481 B1 * 8/2002 Mo ...................... H01L 29/7813
257/E29.066
9,685,435 B2 * 6/2017 Lui ...................... H01L 29/8605
(Continued)

FOREIGN PATENT DOCUMENTS

JP   2006-202931 A   8/2006
JP   2014-107417 A   6/2014
(Continued)

OTHER PUBLICATIONS

Search Report in NL Application No. 2028665, dated Oct. 18, 2023, 17pp.

*Primary Examiner* — S M Sohel Imtiaz
(74) *Attorney, Agent, or Firm* — HAUPTMAN HAM, LLP

(57) ABSTRACT

Provided is a semiconductor device in which a snubber-circuit is incorporated and can realize downsizing of a power conversion circuit into which the semiconductor device is assembled, and is flexibly applicable to various electric equipment. A semiconductor device includes a semiconductor substrate, a source electrode, a drain electrode, a plurality of trenches, a plurality of first electrodes disposed in a plurality of trenches by way of gate insulation films formed on side walls of the plurality of respective trenches, a plurality of second electrodes disposed above the plurality of first electrodes in a state where the second electrodes are spaced apart from the first electrodes, a plurality of first insulation regions, and a plurality of second insulation regions. The trenches, the first electrodes and the second electrodes are formed in stripes as viewed in a plan view. At least one of the plurality of second electrodes is connected to the drain electrode.

10 Claims, 19 Drawing Sheets

(51) Int. Cl.
*H01L 29/40* (2006.01)
*H01L 29/423* (2006.01)
*H01L 29/66* (2006.01)
*H02M 1/34* (2007.01)

(52) U.S. Cl.
CPC .... *H01L 29/4236* (2013.01); *H01L 29/66734* (2013.01); *H02M 1/34* (2013.01)

(58) Field of Classification Search
CPC ............ H01L 27/0629; H01L 29/0696; H01L 29/66727; H01L 29/7803; H02M 1/34; H02M 1/348; H02M 7/003
See application file for complete search history.

(56) References Cited

U.S. PATENT DOCUMENTS

| | | | | |
|---|---|---|---|---|
| 2005/0263795 | A1* | 12/2005 | Choi | H01L 29/78687 257/213 |
| 2006/0157779 | A1 | 7/2006 | Kachi et al. | |
| 2011/0309412 | A1* | 12/2011 | Yuan | H01L 29/7378 257/E21.135 |
| 2012/0241850 | A1* | 9/2012 | Kawaguchi | H01L 29/7803 257/330 |
| 2012/0313161 | A1* | 12/2012 | Grivna | H01L 29/7827 438/270 |
| 2013/0043527 | A1* | 2/2013 | Lui | H01L 29/66734 438/270 |
| 2013/0334599 | A1* | 12/2013 | Pan | H01L 29/7813 257/337 |
| 2016/0190309 | A1* | 6/2016 | Yilmaz | H01L 27/088 257/331 |
| 2017/0062604 | A1* | 3/2017 | Katou | H01L 29/66734 |
| 2017/0263753 | A1 | 9/2017 | Moriya et al. | |
| 2017/0287903 | A1* | 10/2017 | Lui | H01L 29/7813 |
| 2018/0309438 | A1* | 10/2018 | Matsuda | H01L 25/18 |
| 2019/0165165 | A1* | 5/2019 | Kawai | H01L 29/66333 |
| 2019/0341339 | A1 | 11/2019 | Fujita et al. | |
| 2019/0355819 | A1* | 11/2019 | Siemieniec | H01L 29/7802 |

FOREIGN PATENT DOCUMENTS

| | | |
|---|---|---|
| JP | 2017-163107 A | 9/2017 |
| JP | 2019-195013 A | 11/2019 |
| TW | 201306255 A1 | 2/2013 |
| WO | 2018012122 A1 | 1/2018 |

* cited by examiner

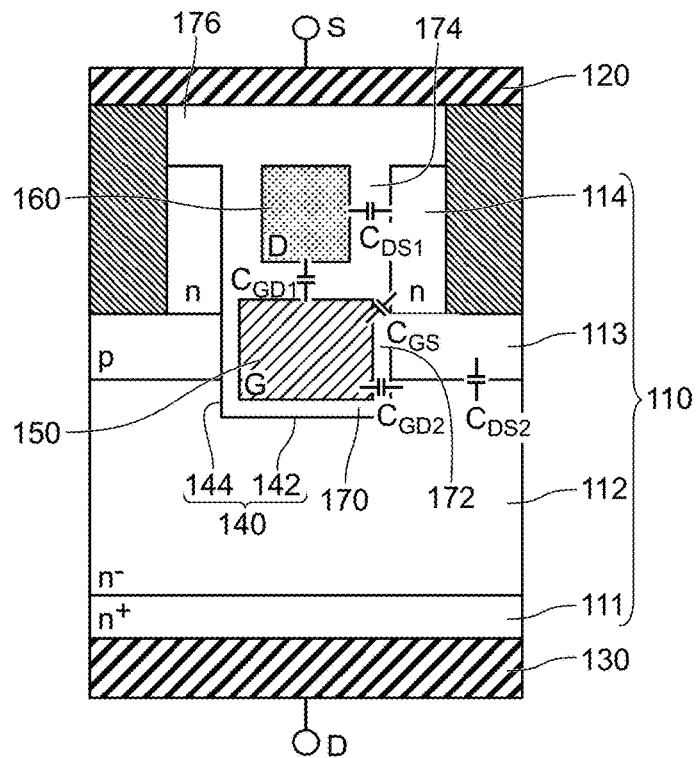
FIG.3A
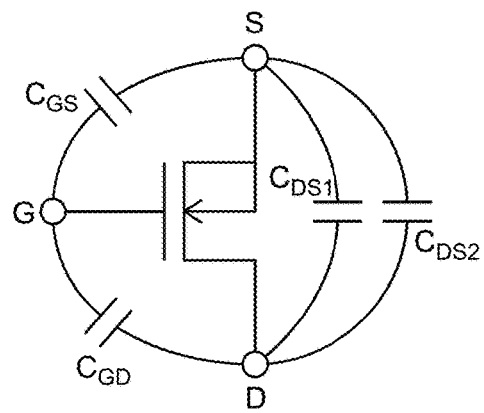
FIG.3B
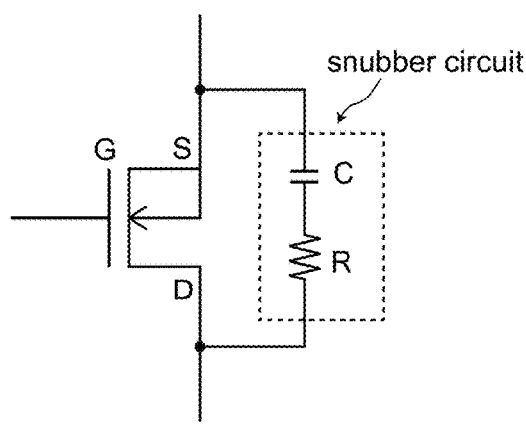
FIG.3C
$$R_1 = \rho \frac{\ell}{S1}$$
$$C_{DS1} = \varepsilon \frac{S2}{tox1}$$
FIG.3D

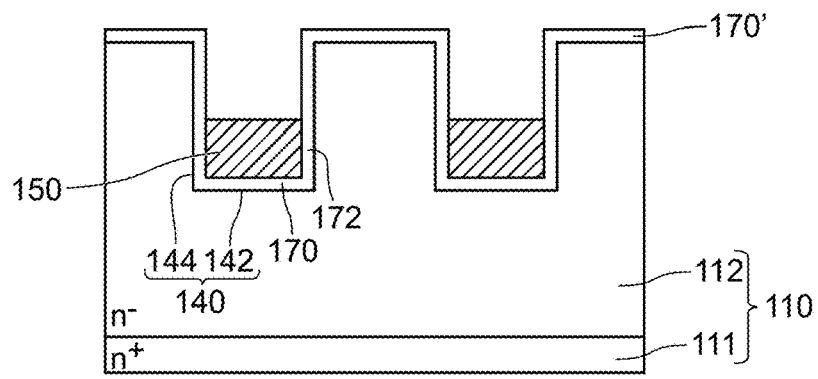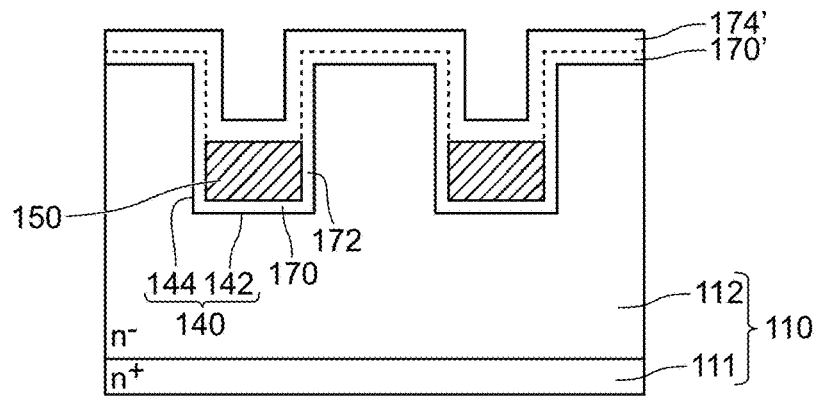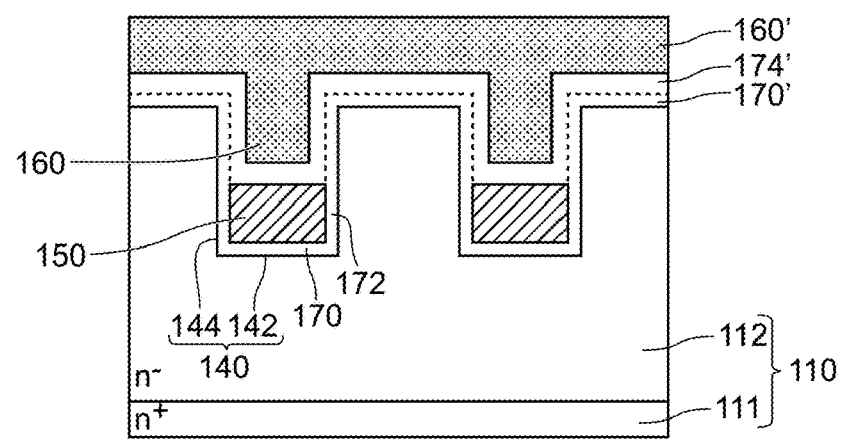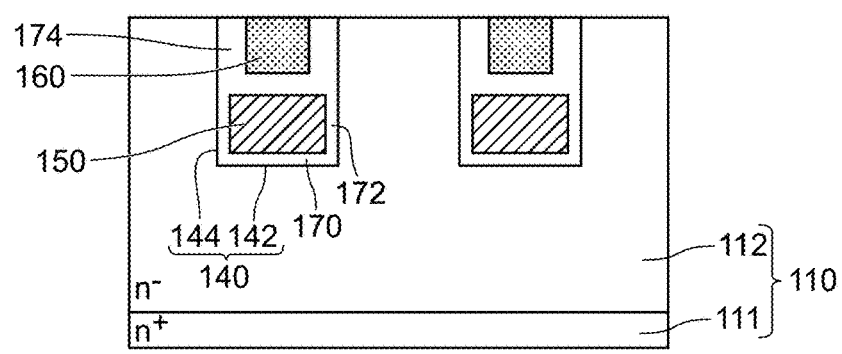

SEMICONDUCTOR DEVICE AND METHOD OF MANUFACTURING SEMICONDUCTOR DEVICE

RELATED APPLICATIONS

The present application claims priority to Japanese Application Number 2020-118213, filed Jul. 9, 2020, the disclosure of which is hereby incorporated by reference herein in its entirety.

BACKGROUND OF THE INVENTION

Field of the Invention

The present invention relates to a semiconductor device and a method of manufacturing a semiconductor device.

Description of the Related Art

Conventionally, there has been known a semiconductor device of a trench gate type (for example, see U.S. Pat. No. 6,429,481).

As shown in FIG. 22, a semiconductor device 900 described in U.S. Pat. No. 6,429,481 is a semiconductor device of a trench gate type which includes: a semiconductor substrate 910 having an n-type drift layer 912, a p-type base region 913 formed on a surface of the drift layer 912, and an n-type source region 914 formed on a surface of the base region 913; a source electrode 920 formed on a surface of the semiconductor substrate 910 on one side; a drain electrode (not shown) formed on a surface of the semiconductor substrate 910 on the other side; a plurality of trenches 940 formed on one surface of the semiconductor substrate 910, wherein each trench 940 has a bottom 942 disposed adjacently to the drift layer 912, and side walls 944 disposed adjacently to the drift layer 912, the base region 913 and the source region 914; and gate electrodes 950 each disposed in the trench 940 by way of gate insulation films 972 formed on the side walls 944 of the plurality of trenches 940 respectively, and having side surfaces which face the base region 913.

There has also been known that, in assembling such a semiconductor device 900 into a power conversion circuit, a snubber circuit which absorbs a switching noise is additionally mounted on the power conversion circuit (a conventional power conversion circuit, for example, see International Publication No. WO 2018/012122).

In the power conversion circuit 9 described in International Publication No. WO 2018/012122, as shown in FIG. 23, a half-bridge circuit where two switching elements (semiconductor devices) are connected in series is formed, and a snubber circuit where a resister and a capacitor are connected to each other in series is connected to each switching elements in parallel.

SUMMARY OF THE INVENTION

However, in additionally mounting the snubber circuit on the power conversion circuit in assembling the semiconductor device into the power conversion circuit, it is necessary to ensure a region for mounting the snubber circuit in the power conversion circuit. Accordingly, there exists a drawback that it is difficult to realize downsizing of the power conversion circuit and, eventually, it is difficult to realize downsizing of electric equipment.

To overcome such a drawback, it may be possible to provide a semiconductor device in which a snubber-circuit is incorporated. In this case, however, it is necessary to design and manufacture a semiconductor device where a snubber capacitance of a snubber circuit is changed corresponding to electric equipment. Accordingly, there exists a drawback that it is difficult to provide semiconductor device in which a snubber-circuit is incorporated and is flexibly applicable to various electric equipment.

The present invention has been made to overcome the above-mentioned drawback, and it is an object of the present invention to provide a semiconductor device in which a snubber-circuit is incorporated and can realize downsizing of a power conversion circuit into which the semiconductor device is assembled, and is flexibly applicable to various electric equipment.

A semiconductor device according to the present invention includes: a semiconductor substrate having a drift layer of a first conductive type, a base region of a second conductive type formed on a surface of the drift layer, and a source region of the first conductive type formed on a surface of the base region; a source electrode formed on a surface of the semiconductor substrate on one side; a drain electrode formed on a surface of the semiconductor substrate on the other side; a plurality of trenches formed on the surface of the semiconductor substrate on said one side and each having a bottom disposed adjacently to the drift layer, and side walls disposed adjacently to the drift layer, the base region and the source region; a plurality of first electrodes each disposed in each of the plurality of trenches by way of a gate insulation film formed on the respective side walls of each of the plurality of trenches, a side surface of each of the plurality of first electrode facing the base region; a plurality of second electrodes formed above the respective first electrodes in a state where the plurality of second electrodes are spaced apart from the first electrodes; a plurality of first insulation regions, each of the plurality of first insulation regions being formed between the bottom of the trench and the first electrode so as to make the first electrode spaced apart from the bottom of the trench; and a plurality of second insulation regions, each of the plurality of second insulation regions expanding between the second electrode and the first electrode so as to make the second electrode spaced apart from the first electrode, and expanding between the second electrode and the side wall of the trench so as to make the second electrode spaced apart from the side walls of the trench, wherein the trenches, the first electrodes and the second electrodes are formed in stripes as viewed in a plan view, and at least one of the plurality of the second electrodes is connected to the drain electrode.

A method of manufacturing a semiconductor device for manufacturing the semiconductor device is a method of manufacturing the semiconductor device according to the present invention, and includes in a following order: a semiconductor substrate preparation step in which the semiconductor substrate having the drift layer of the first conductive type is prepared; a trench forming step in which the plurality of trenches in stripe shapes as viewed in a plan view are formed; a first insulation film forming step in which each of the plurality of first insulation regions is formed on the bottom of each of the plurality of the trenches by forming the first insulation film on the bottom and the side walls of each of the plurality of trenches, and forming the gate insulation film on the side walls of each of the plurality of trenches; a first electrode forming step in which each of the plurality of first electrodes is formed in each of the plurality of trenches by way of the gate insulation film; a second insulation film forming step in which each of the second insulation films is formed on a surface of each of the plurality of first insulation films on the side walls of each of the plurality of trenches and on a surface of each of the plurality of first electrodes; a second electrode forming step in which each of the second electrodes is formed above each of the plurality of first electrodes in a state where each of the plurality of second electrode is spaced apart from each of the plurality of first electrode by way of the plurality of second insulation film; and a source electrode and drain electrode forming step which has a step in which the source electrode is formed on the surface of the semiconductor substrate on the one side, and a step in which the drain electrode is formed on the surface of the semiconductor substrate on said the other side.

In the semiconductor device and the method of manufacturing a semiconductor device, the semiconductor device includes the plurality of second electrodes above the first electrode in a spaced-apart manner from the first electrode, and at least one of the plurality of second electrodes is connected to the drain electrode. With such a configuration, it is possible to form a snubber circuit in which a parasitic capacitance between the second electrode and the source region can be used as a capacitor (a part of the capacitor), and an internal resistance of the second electrode itself is used as a resistance. Accordingly, in incorporating the semiconductor device in a power conversion circuit, it is unnecessary to additionally mount the snubber circuit. As a result, it is unnecessary to ensure a region for mounting the snubber circuit and hence, downsizing of the power conversion circuit can be realized.

In the semiconductor device and the method of manufacturing a semiconductor device, the second electrodes are formed in a strip shape as viewed in a plan view, and at least one of the plurality of second electrodes is connected to the drain electrode. With such a configuration, by limiting a length and a cross-sectional area of the second electrode or the number of second electrodes connected to the drain electrode or the like, a snubber capacitance (a resistance value of resistance and an electrostatic capacitance of a capacitor in the snubber circuit) can be adjusted in conformity with electric equipment. Accordingly, it is unnecessary to redesign or remanufacture a semiconductor device where a snubber capacitance of a snubber circuit is changed corresponding to electric equipment. Accordingly, it is possible to provide a semiconductor device which incorporates a snubber circuit flexibly applicable to various electric equipment.

In the method of manufacturing a semiconductor device according to the present invention, the method includes the first insulation film forming step in which the gate insulation film is formed before other insulation films are formed after the trench forming step (see FIG. 4C) and hence, the gate insulation film can be directly formed on the side wall of the trench before other insulation films are formed. Accordingly, the gate insulation film which is required to satisfy uniformity in film thickness can be formed with high accuracy.

BRIEF DESCRIPTION OF THE DRAWINGS

FIG. 1A and FIG. 1B are views for describing a semiconductor device 100 according to an embodiment 1, wherein FIG. 1A is a planar cross-sectional view of the semiconductor device 100, and FIG. 1B is a cross-sectional view taken along a line A-A in FIG. 1A;

FIG. 2A and FIG. 2B are views for describing a peripheral portion of the semiconductor device 100 according to the embodiment 1, wherein FIG. 2A is a cross-sectional view taken along a line B-B in FIG. 1A, and FIG. 2B is a cross-sectional view taken along a line C-C in FIG. 1A;

FIG. 3A to FIG. 3D are views for describing a snubber circuit in the semiconductor device 100 according to the embodiment 1, wherein FIG. 3A is a view showing a parasitic electrostatic capacitance of the semiconductor device 100, FIG. 3B is a view showing a relationship between the semiconductor device 100 and an electrostatic capacitance, FIG. 3C is a view showing an equivalent circuit of the semiconductor device and the snubber circuit, and FIG. 3D is a view showing equations expressing a resistance and an electrostatic capacitance $C_{DS1}$ per one snubber electrode 1;

FIG. 4A to FIG. 4D are views showing a method of manufacturing the semiconductor device 100 according to the embodiment 1, wherein FIG. 4A to FIG. 4D are views showing respective steps;

FIG. 5A to FIG. 5D are views showing the method of manufacturing the semiconductor device 100 according to the embodiment 1, wherein FIG. 5A to FIG. 5D are views showing respective steps;

FIG. 6A to FIG. 6D are views showing the method of manufacturing the semiconductor device 100 according to the embodiment 1, wherein FIG. 6A to FIG. 6D are views showing respective steps;

FIG. 7A to FIG. 7C are views showing the method of manufacturing the semiconductor device 100 according to the embodiment 1, wherein FIG. 7A to FIG. 7C are views showing respective steps;

FIG. 9A to FIG. 9D are views showing a method of manufacturing the semiconductor device 800 according to the comparative example, wherein FIG. 9A to FIG. 9D are views showing respective steps, and symbol M1 indicates a mask;

FIG. 10A to FIG. 10D are views showing the method of manufacturing the semiconductor device 800 according to the comparative example, wherein FIG. 10A to FIG. 10D are views showing respective steps;

FIG. 11A to FIG. 11D are views showing the method of manufacturing the semiconductor device 800 according to the comparative example, wherein FIG. 11A to FIG. 11D are views showing respective steps;

FIG. 13A and FIG. 13B are views for describing a semiconductor device 102 according to a modification 1, wherein FIG. 13A is a plan view of the semiconductor device 102, and FIG. 13B is a cross-sectional view taken along a line D-D in FIG. 13A;

FIG. 14A and FIG. 14B are views for describing a semiconductor device 102a according to a modification 2, wherein FIG. 14A is a plan view of the semiconductor device 102a, and FIG. 14B is a cross-sectional view taken along a line E-E in FIG. 14A;

FIG. 21A and FIG. 21B are views for describing a semiconductor device 109 according to a modification 7, wherein FIG. 21A is a plan view of the semiconductor device 109, and FIG. 21B is a cross-sectional view taken along a line F-F in FIG. 21A;

DETAILED DESCRIPTION OF THE PREFERRED EMBODIMENTS

Figure 1A:
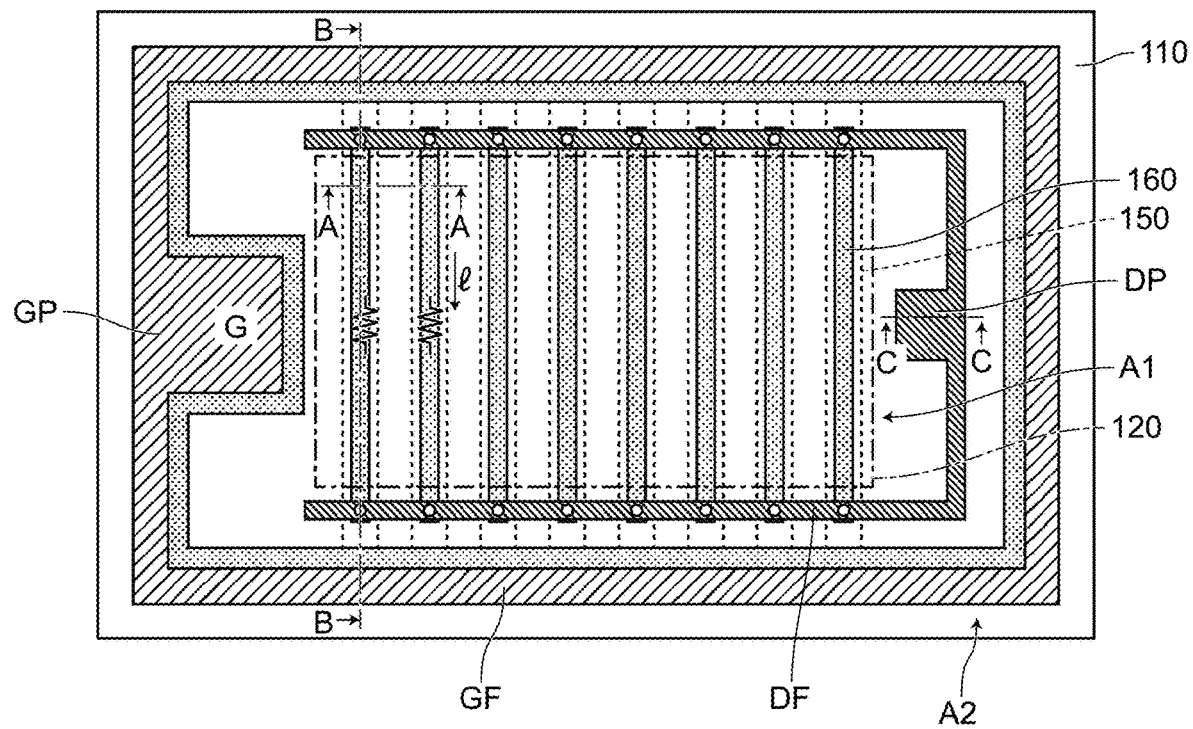

Hereinafter, a semiconductor device and a method of manufacturing a semiconductor device according to the present invention are described in accordance with embodiments shown in the drawings. The respective drawings are schematic drawings, and do not always strictly reflect actual sizes of constitutional elements. The respective embodiments described hereinafter are not intended to limit the invention relating to Claims. Further, it is not always a case that all of various elements described in the respective embodiments and combinations of these elements are indispensable as means for solving problems of the present invention. In the respective embodiments, constitutional elements basically having the same configurations, technical features and functions (including constitutional elements which are not completely identical with respect to shapes or the like) are indicated by using the same symbols in all embodiments, and the description of these constitutional elements may be omitted.

Embodiment 1

1. Configuration of Semiconductor Device 100 According to Embodiment 1

As shown in FIG. 1A, a semiconductor device 100 according to an embodiment 1 is a semiconductor device (MOSFET) of a trench gate type which includes a cell region A1 and a peripheral region A2 which is defined in a region which surrounds the cell region A1. The cell region A1 is a region where a source electrode 120 is disposed on a surface of a semiconductor substrate 110 on one side. The peripheral region A2 is a region where a drain finger DF, a drain pad DP, a gate finger GF and a gate pad GP are disposed at a position which surrounds the cell region A1. In the embodiment 1, the semiconductor substrate 110 has a rectangular shape as viewed in a plan view. The gate pad GP is formed on one short side of the rectangular shape. Strip-shaped gate electrodes 150 and strip-shaped snubber electrodes 160 extend from one long side disposed adjacently to the short side on which the gate pad GP is formed to the other long side disposed adjacently to the short side on which the gate pad GP is formed (from an upper side to a lower side in FIG. 1A). That is, the gate electrodes 150 and the snubber electrodes 160 are formed in stripes longitudinally traversing the cell region A1.

The semiconductor device 100 according to the embodiment 1 includes, in the peripheral region A2, drain lead lines 162 (see FIG. 2A and FIG. 2B), the drain pad DP (see FIG. 1A), the drain finger DF, gate lead lines 152 (see FIG. 2A and FIG. 2B), the gate pad GP (see FIG. 1A) and the gate finger GF. On an outer edge portion of the peripheral region A2, a base region 113 of the semiconductor substrate 110 is not formed. In this specification, an n-type layer of a region where the base region 113 is formed is referred to as a drift layer 112, and an n-type layer of a region where the base region 113 is not formed is referred to as an n-type semiconductor layer 117 (see FIG. 2B).

Figure 2A:
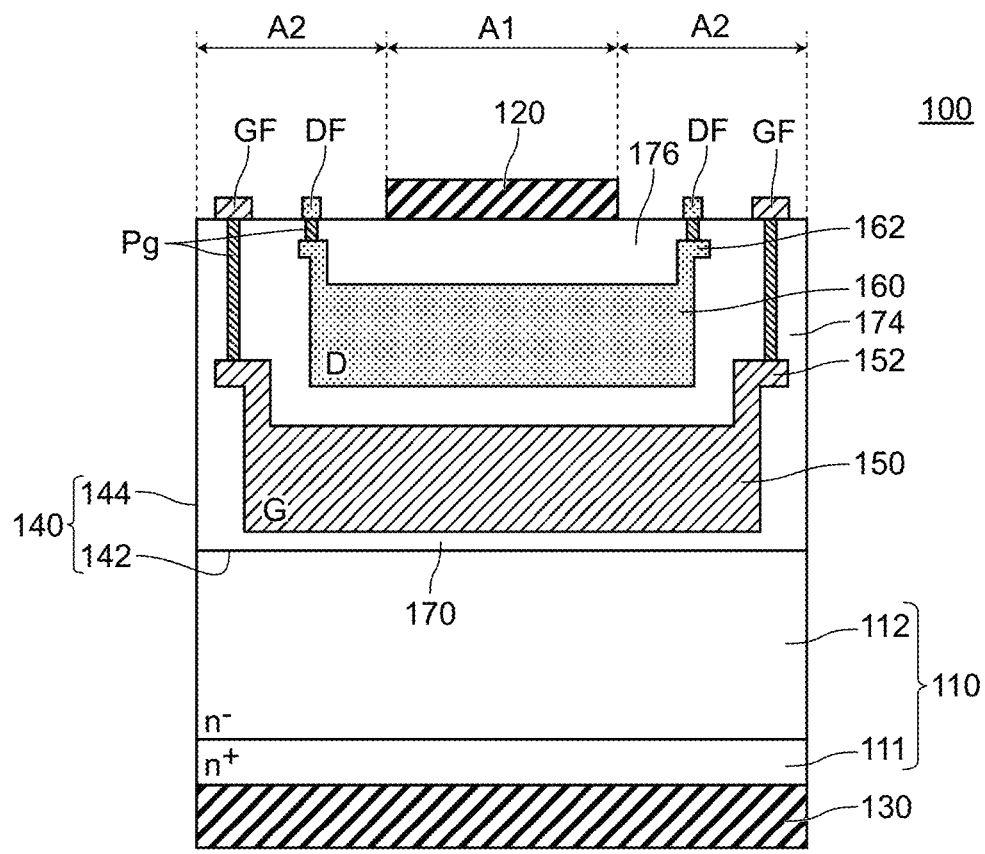
Figure 2B:
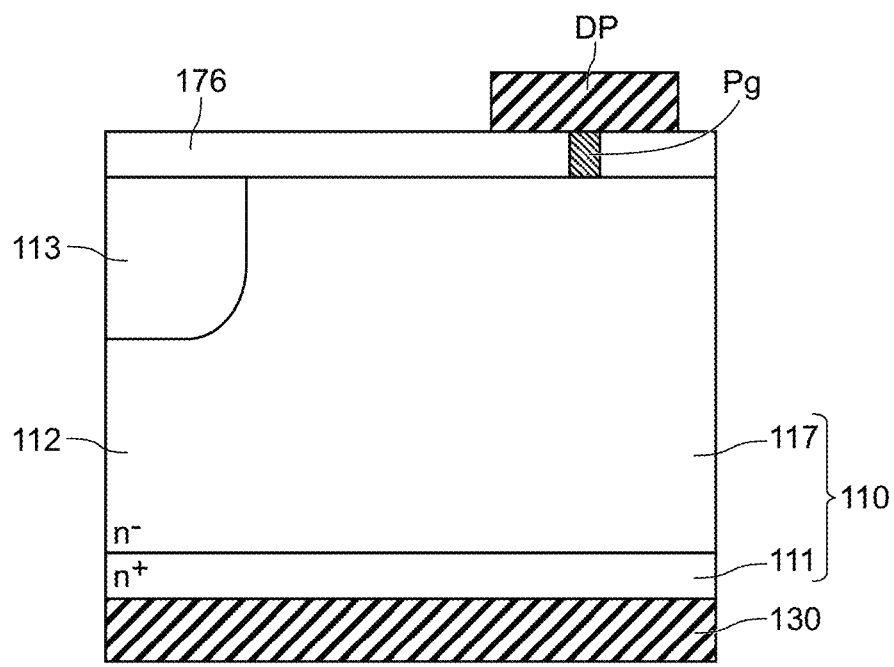

The drain lead line 162 is formed on both ends of the snubber electrode 160 having a strip shape as viewed in a plan view (see FIG. 2A). The drain lead line 162 is made of polysilicon containing a dopant at the same concentration as the snubber electrode 160 described later.

The drain pad DP is formed on a third insulation region 176 (interlayer insulation film) described later. A contact hole is formed in the third insulation region 176 just below the drain pad DP. The drain pad DP is connected to the n-type semiconductor layer 117 of the semiconductor substrate 110 via a metal plug Pg in the contact hole (see FIG. 2B).

The drain finger DF is formed such that the drain finger DF surrounds the cell region A1 from the drain pad DP as viewed in a plan view (see FIG. 1A and FIG. 1B), and the drain finger DF is formed on the third insulation region 176 (see FIG. 2A). A contact hole is formed in the third insulation region 176 just below the drain finger DF, and the drain finger DF is connected to the drain lead line 162 via a metal plug Pg in the contact hole.

The gate lead line 152 is formed on both ends of the gate electrode 150 having a strip shape as viewed in a plan view (see FIG. 2A). The gate lead line 152 is made of polysilicon containing a dopant at the same concentration as the gate electrode 150 described later.

The gate pad GP is connected to a gate terminal for external connection not shown in the drawings. The gate pad GP is formed on the third insulation region 176.

The gate finger GF is formed such that the gate finger GF surrounds the cell region A1, the drain pad DP and the drain finger DF from the gate pad GP as viewed in a plan view (see FIG. 1A), and the gate finger GF is formed on the third insulation region 176. A contact hole is formed in the third insulation region 176 just below the gate finger GF, and the gate finger GF is connected to the gate lead line 152 via a metal plug Pg in the contact hole (see FIG. 2A).

Figure 1B:
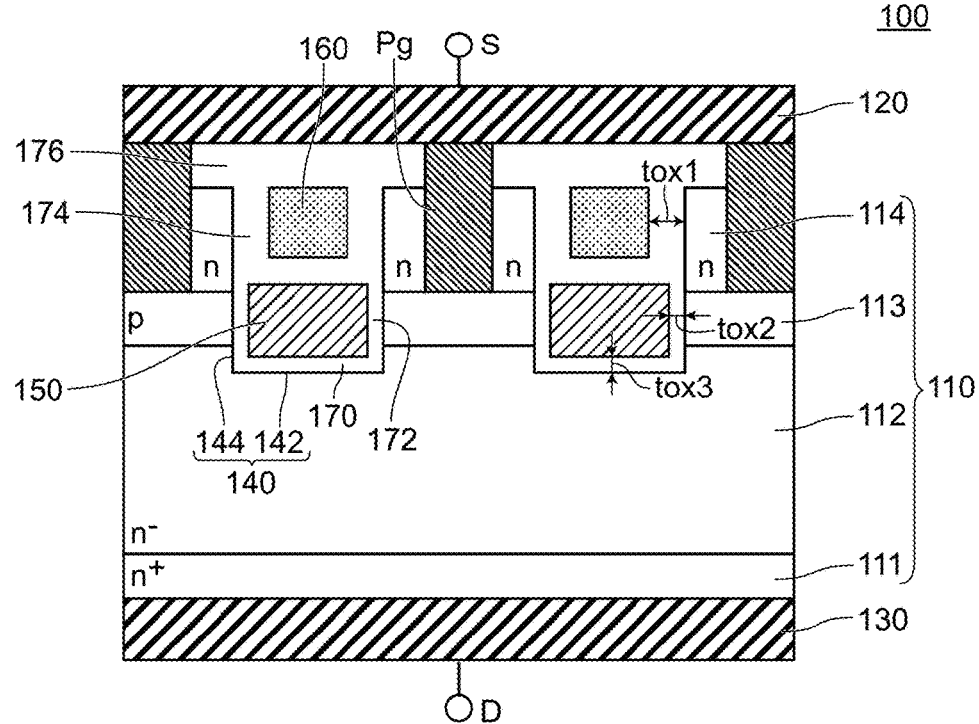

The semiconductor device 100 according to the embodiment 1 includes, in the cell region A1, as shown in FIG. 1B, the semiconductor substrate 110, the source electrode 120, a drain electrode 130, a plurality of trenches 140, the gate electrodes 150 (first electrodes), the snubber electrodes 160 (second electrodes), first insulation regions 170, gate insulation films 172, second insulation regions 174, and the third insulation region 176.

The semiconductor substrate 110 has: an n$^+$-type low-resistance semiconductor layer 111; the n-type drift layer 112 formed on the low-resistance semiconductor layer 111 and having lower dopant concentration than the low-resistance semiconductor layer 111; the p-type base region 113 formed on a surface of the drift layer 112; and an n-type source region 114 disposed on a surface of the base region 113 and having higher dopant concentration than the drift layer 112.

A thickness of the low-resistance semiconductor layer 111 is set to 50 μm to 500 μm (for example, 350 μm), and dopant concentration of the low-resistance semiconductor layer 111 is $1 \times 10^{18}$ cm$^{-3}$ to $1 \times 10^{21}$ cm$^{-3}$ (for example, $1 \times 10^{19}$ cm$^{-3}$). A thickness of the drift layer 112 in the region where the trench 140 is not formed is 3 μm to 50 μm (for example, 15 μm), and dopant concentration of the drift layer 112 is $1 \times 10^{14}$ cm$^{-3}$ to $1 \times 10^{19}$ cm$^{-3}$ (for example, $1 \times 10^{15}$ cm$^{-3}$). A thickness of the base region 113 is 0.5 μm to 10 μm (for example, 5 μm), and dopant concentration of the base region 113 is $1 \times 10^{16}$ cm$^{-3}$ to $1 \times 10^{19}$ cm$^{-3}$ (for example, $1 \times 10^{17}$ cm$^{-3}$).

The source electrode 120 is formed on a surface of the semiconductor substrate 110 on one side by way of the third insulation region 176. The source electrode 120 is in contact with the source region 114 and the base region 113 via the metal plugs Pg in the contact holes formed in the third insulation region 176. The source electrode 120 is formed of, for example, an Al film or an Al alloy film (for example, an AlSi film). A thickness of the source electrode 120 is 1 μm to 10 μm (for example, 3 μm). The drain electrode 130 is formed on a surface of the semiconductor substrate 110 on the other side (on a surface of the low-resistance semiconductor layer 111). The drain electrode 130 is formed of a stacked layer film where a Ti layer, an Ni layer, an Au layer (or an Ag layer) are stacked in this order. A thickness of the drain electrode 130 is 0.2 μm to 1.5 μm (for example, 1 μm).

The plurality of trenches 140 are formed on one surface of the semiconductor substrate 110. Each of the plurality of trenches 140 has a bottom 142 disposed adjacently to the drift layer 112, and side walls 144 disposed adjacently to drift layer 112, the base region 113 and the source region 114. A lowermost portion of the trench 140 is positioned deeper than a position of pn junction between the drift layer 112 and the base region 113.

The gate electrode 150 is disposed in each trench 140 by way of the gate insulation film 172 formed on each side wall 144 (a portion of the side wall 144 on a lower side) of the plurality of trenches 140. Side surfaces of the gate electrode 150 face the base region 113. An upper surface of the gate electrode 150 is disposed at a depth position shallower than a deepest portion of the source region 114, and a lower surface of the gate electrode 150 is disposed at a depth position equal to a depth position of a pn junction surface between the base region 113 and the drift layer 112 or at a depth position deeper than the depth position of the pn junction surface. The gate electrode 150 is formed in a strip shape as viewed in a plan view, and the respective snubber electrodes 160 are formed in stripes. The gate lead lines 152 are formed on end portions of the gate electrode 150 having a strip shape (see FIG. 2A), and the gate electrode 150 is connected to an external gate terminal via the gate lead lines 152, the metal plugs Pg, the gate fingers GF and the gate pad GP.

The snubber electrodes 160 are made of polysilicon containing a dopant at predetermined concentration. The snubber electrode 160 is disposed in the trench 140 in a state where the snubber electrode 160 is disposed above the gate electrode 150 in a spaced-apart manner so as to sandwich the second insulation region 174 between the snubber electrode 160 and the gate electrode 150. A depth position of a lower surface of the snubber electrode 160 is shallower than a depth position of a lowermost portion of a contact surface between the source region 114 and the trench 140. A depth position of an upper surface of the snubber electrode 160 may be equal to a height position of the surface of the semiconductor substrate 110 in the region where the trench 140 is not formed, or may be disposed at a depth position deeper than a height (depth) position of the surface of the semiconductor substrate 110. The depth position of the upper surface of the snubber electrode 160 may also be disposed at a height position above the height (depth) position of the surface of the semiconductor substrate 110.

The snubber electrodes 160 are formed in stripes (each snubber electrode having a strip shape) as viewed in a plan view. A width (a width in a transverse direction in FIG. 1B which is a cross sectional view) of the snubber electrode 160 is smaller than a width of the gate electrode 150. The drain lead line 162 is formed on an end portion of the snubber electrode 160 having a strip shape (see FIG. 2A). The snubber electrodes 160 are electrically connected to the drain electrode 130 via the drain lead lines 162, the metal plugs Pg, the drain fingers DF, the drain pad DP, the metal plugs Pg, the n-type semiconductor layer 117 and the low-resistance semiconductor layer 111.

The first insulation region 170 is formed between the bottom 142 of the trench 140 and the gate electrode 150 so as to make the gate electrode 150 spaced apart from the bottom 142 of the trench 140. The gate insulation film 172 is formed on a surface of the side wall (a portion of the side wall 144 on a lower side) of the trench 140. The gate insulation film 172 makes the gate electrode 150 spaced apart from the side walls 144 of the trench 140. In the embodiment 1, the first insulation region 170 is formed together with the gate insulation film 172. The first insulation region 170 has the same film thickness as the gate insulation film 172. However, the first insulation region 170 may have a larger film thickness than the gate insulation film 172. The first insulation region 170 and the gate insulation film 172 are formed of a thermal oxide film. However, the first insulation region 170 and the gate insulation film 172 may be formed of a CVD oxide film.

The second insulation region 174 expands between the gate electrode 150 and the snubber electrode 160 so as to make the snubber electrode 160 spaced apart from the gate electrode 150. The second insulation region 174 also expands between the snubber electrode 160 and the side wall 144 of the trench 140 so as to make the snubber electrode 160 spaced apart from the side wall 144 of the trench 140. A film thickness $t_{ox1}$ of the second insulation region 174 between the side wall 144 of the trench 140 and the snubber electrode 160 is larger than a film thickness $t_{ox2}$ of the gate insulation film 172, and is also larger than a film thickness $t_{ox3}$ of the first insulation region 170. A film thickness of the second insulation region 174 between the snubber electrode 160 and the gate electrode 150 is smaller than the film thickness $t_{ox1}$ of the second insulation region 174 between the snubber electrode 160 and the side wall 144 of the trench 140. The second insulation region 174 is formed of a CVD oxide film formed by a CVD method. However, the second insulation region 174 may be formed of a thermal oxide film.

The third insulation region 176 expands between the source electrode 120 and the snubber electrodes 160 so as to make the source electrode 120 spaced apart from the snubber electrodes 160. When wires or the like are bonded to the source electrode 120 at the time of mounting the semiconductor device 100, the third insulation region 176 reduces an effect such as vibrations or heat given to the snubber electrodes 160 and the gate electrodes 150.

The plurality of trenches 140, the gate electrodes 150 in the trenches 140, the snubber electrodes 160, and the source regions 114 are formed in stripes as viewed in a plan view.

2. Snubber Circuit in Semiconductor Device 100 According to Embodiment 1

As described above, the snubber electrodes 160 are formed in the semiconductor device 100 according to the embodiment 1, and the snubber electrodes 160 are connected to the drain electrode 130. The semiconductor device 100 according to the embodiment 1 also includes the second insulation region 174. The second insulation region 174 expands between the snubber electrode 160 and the gate electrode 150 so as to make the snubber electrode 160 spaced apart from the gate electrode 150, and expands between the snubber electrode 160 and the side wall 144 of the trench 140 so as to make the snubber electrode 160 spaced apart from the side wall 144 of the trench 140.

With such a configuration, as shown in FIG. 3A, an electrostatic capacitance $C_{DS1}$ exists between the snubber electrode 160 and the source region 114. As shown in FIG. 1A, the plurality of snubber electrodes 160 are formed in stripes and hence, the electrostatic capacitance $C_{DS1}$ exists in the respective snubber electrodes 160. Further, an electrostatic capacitance $C_{DS2}$ exists between the base region 113 and the drift layer 112. Accordingly, such a configuration is equivalent to a configuration shown in FIG. 3B where the electrostatic capacitance $C_{DS1}$ (a combined capacitance of electrostatic capacitances $C_{DS1}$ between the respective snubber electrodes 160 and the source region 114) and the electrostatic capacitance $C_{DS2}$ are disposed between the source electrode 120 and the drain electrode 130. These electrostatic capacitances (parasitic capacitances) form a capacitor C between the source electrode 120 and the drain electrode 130 (see FIG. 3C).

The snubber electrode 160 is made of polysilicon containing a dopant at predetermined concentration, and the snubber electrodes 160 are formed in stripes as viewed in a plan view (see FIG. 1A). Accordingly, an internal resistance exists in the snubber electrode 160. A combined resistance of the inner resistances in the respective snubber electrodes 160 forms a resistance between the above-mentioned capacitor C and the drain electrode 130 (see FIG. 3C).

From the above-mentioned configuration, it is safe to say that the semiconductor device 100 is a semiconductor device (MOSFET) which incorporates an RC snubber circuit where the capacitor C and the resistance R are connected to each other in series.

Assuming an electric resistance ratio as ρ, a cross-sectional area of the snubber electrode 160 as S1, and a length (a length along a current path) of the snubber electrode 160 as l, as shown in FIG. 3D, an internal resistance R1 of the snubber electrode 160 per one stripe is proportional to the electric resistance ratio ρ and the length l of the snubber electrode 160, and is inversely proportional to the cross-sectional area S1 of the snubber electrode 160. Accordingly, the cross-sectional area S1 (lateral width×height in FIG. 1B) of the snubber electrode 160 can be adjusted by adjusting a film thickness of the second insulation region 174. Further, the length l of the snubber electrode 160 having a strip shape can be also adjusted. Accordingly, a resistance value of the snubber electrode 160 per one stripe shape can be relatively easily adjusted. As a result, the resistance R of the snubber circuit can be relatively easily adjusted. The electric resistance ratio ρ also depends on dopant concentration at which a dopant is introduced into polysilicon and hence, the resistance value of the snubber electrode 160 can be adjusted also from this aspect.

With respect to the capacitor of the snubber circuit, the electrostatic capacitance $C_{DS1}$ becomes as follows. Assuming a dielectric constant of the second insulation region 174 as ε, a length between the snubber electrode 160 and the source region 114, that is, a thickness of the second insulation region 174 as $t_{ox1}$, and an area of a region where the snubber electrode 160 and the source region 114 face each other as S2, as shown in FIG. 3D, the electrostatic capacitance $C_{DS1}$ of the snubber electrode 160 per one stripe is inversely proportional to the film thickness $t_{ox1}$ of the second insulation region 174 and is proportional to the area S2 of the region where the snubber electrode 160 and the source region 114 face each other.

In such a configuration, the film thickness $t_{ox1}$ of the second insulation region 174 can be relatively easily adjusted. Further, the area S2 of the region where the snubber electrode 160 and the source region 114 face each other is proportional to a height of the snubber electrode 160. Accordingly, by adjusting the film thickness of the second insulation region 174, the area S2 of the region where the snubber electrode 160 and the source region 114 face each other can also be adjusted. Accordingly, the electrostatic capacitance $C_{DS1}$ between the snubber electrode 160 per one stripe and the source region 114 can be easily adjusted. As a result, the electrostatic capacitance of the snubber circuit can be relatively easily adjusted.

Accordingly, a resistance value and an electrostatic capacitance of the snubber circuit in the semiconductor device 100 according to the embodiment 1 can be easily adjusted and hence, a semiconductor device having high flexibility can be provided.

3. Method of Manufacturing Semiconductor Device According to Embodiment 1

The semiconductor device 100 according to the embodiment 1 can be manufactured in accordance with the following steps. In the method of manufacturing a semiconductor device according to the embodiment 1, as shown in FIG. 4A to FIG. 7C, a semiconductor substrate preparation step, a trench forming step, a first insulation film forming step, a gate electrode forming step (first electrode forming step), a second insulation film forming step, a snubber electrode forming step, a source region and base region forming step, a third insulation film forming step, a contact step, and a source electrode and drain electrode forming step are performed in this order.

(1) Semiconductor Substrate Preparation Step

Figure 4A:
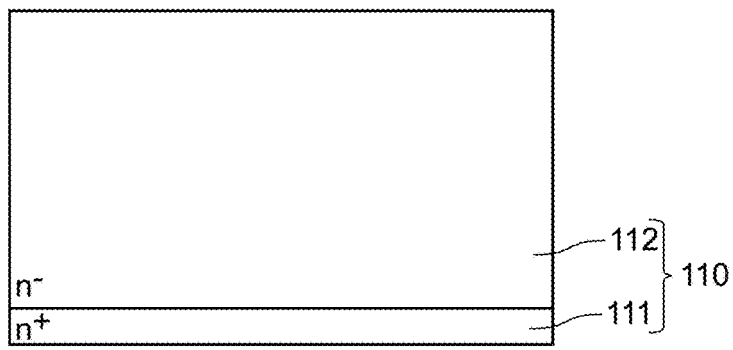

First, a semiconductor substrate 110 is prepared (see FIG. 4A). The semiconductor substrate 110 has a $n^+$-type low-resistance semiconductor layer 111, and a n-type drift layer 112 formed on the low-resistance semiconductor layer 111.

(2) Trench Forming Step

Figure 4B:
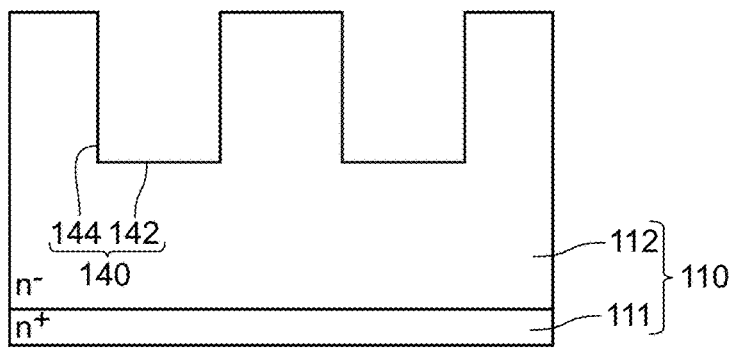

Next, a plurality of trenches 140 in stripe shapes as viewed in a plan view are formed on the drift layer 112 (see FIG. 4B).

(3) First Insulation Film Forming Step

Figure 4C:
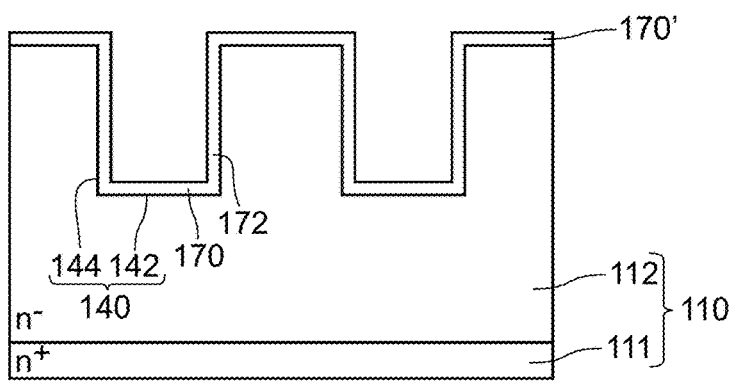
Figure 4D:
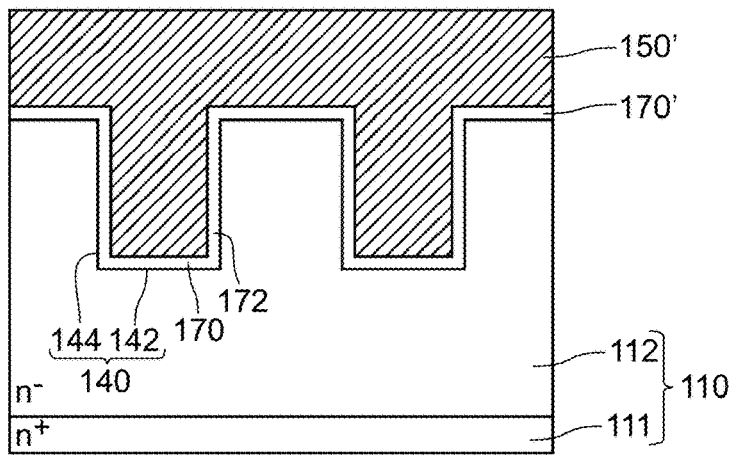

Next, a first insulation film 170' is formed on one surface (a surface on a drift layer 112 side, such a surface including inner surfaces of the trenches 140) of the semiconductor substrate 110 (see FIG. 4C). Accordingly, a first insulation region 170 is formed on bottoms 142 of the plurality of respective trenches 140, and a gate insulation film 172 is formed on side walls 144 of the plurality of respective trenches. The first insulation film 170' is formed by a thermal oxidation method, for example.

(4) Gate Electrode Forming Step (First Electrode Forming Step)

Next, a gate electrode 150 is formed in the trench 140 by way of the first insulation region 170 and the gate insulation film 172. Specifically, first, polysilicon 150' having predetermined dopant concentration is formed on the whole region of a surface of the semiconductor substrate 110 on one side (see FIG. 4D). In this step, gate lead lines 152 are formed in a peripheral region A2. Then, the gate electrodes 150 are formed by etching the polysilicon 150' (see FIG. 5A). The polysilicon 150' may be formed by forming polysilicon and thereafter, by injecting a p-type dopant (for example, boron) in the polysilicon by ion implantation. Alternatively, the polysilicon 150' may be formed by growing polysilicon in a p-type dopant atmosphere (doped polysilicon).

(5) Second Insulation Film Forming Step

Next, a second insulation film 174' is formed on a surface of the first insulation film 170' which is formed on surfaces of side walls 144 of the trenches 140 and the surface of the semiconductor substrate 110 and on surfaces of the gate electrodes 150 (see FIG. 5B). Accordingly, a second insulation region 174 on a gate electrode 150 side is formed using the second insulation film 174' on the gate electrode 150 (see FIG. 5D), and a second insulation region 174 on a side wall 144 side of the trenches 140 is formed using the first insulation film 170' and the second insulation film 174' which are stacked on surfaces of side walls at upper sides of the trenches 140 (upper side walls) (see FIG. 5D). The second insulation film 174' is formed by a CVD method. However, the second insulation film 174' may be a thermal oxide film formed by a thermal oxidation method.

(6) Snubber Electrode Forming Step (Second Electrode Forming Step)

Next, snubber electrodes 160 are formed on the gate electrodes 150 in a spaced-apart manner from the gate electrodes 150. Specifically, first, polysilicon 160' is formed on the whole surface of the semiconductor substrate 110 on one side (see FIG. 5C). In this step, drain lead lines 162 are formed in the peripheral region A2. Next, the polysilicon 160' is removed by etching such that an upper surface of the polysilicon 160' is positioned at the same depth position as the surface of the semiconductor substrate 110 or at a depth position deeper than such a depth position. At the same time, the first insulation film 170' and the second insulation film 174' formed on the surface of the semiconductor substrate 110 are removed by etching (see FIG. 5D).

(7) Source Region and Base Region Forming Step

Figure 6A:
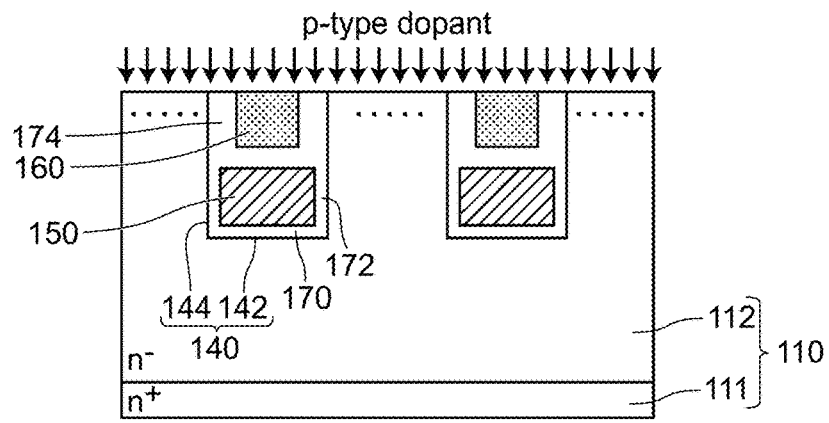
Figure 6B:
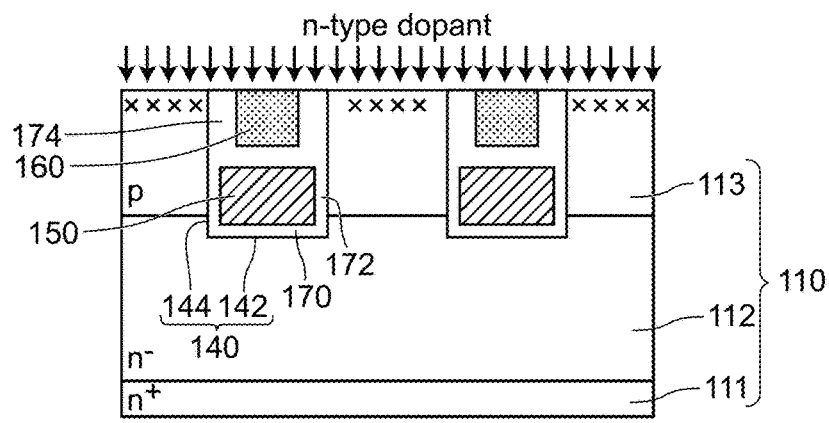

Next, a p-type dopant (for example, boron) is injected into the semiconductor substrate 110 from a surface of the semiconductor substrate 110 on one side by ion implantation such that the p-type dopant reaches a predetermined depth (see FIG. 6A). Next, a base region 113 is formed by activating the p-type dopant. Then, an n-type dopant (for example, phosphorus) is injected into the semiconductor substrate 110 from one surface side of the semiconductor substrate 110 by ion implantation such that the n-type dopant reaches a predetermined depth (see FIG. 6B). Next, a source region 114 is formed by activating the n-type dopant.

(8) Third Insulation Film Forming Step

Figure 6C:
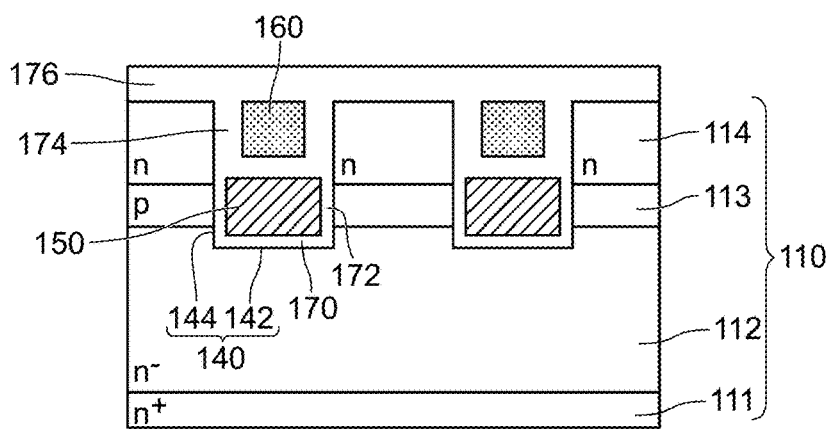

Next, a third insulation film (third insulation region 176) is formed on the surface of the semiconductor substrate 110 and on the second insulation regions 174 and the snubber electrodes 160 (see FIG. 6C). The third insulation film is formed by a CVD method, for example.

(9) Contact Forming Step

Figure 6D:
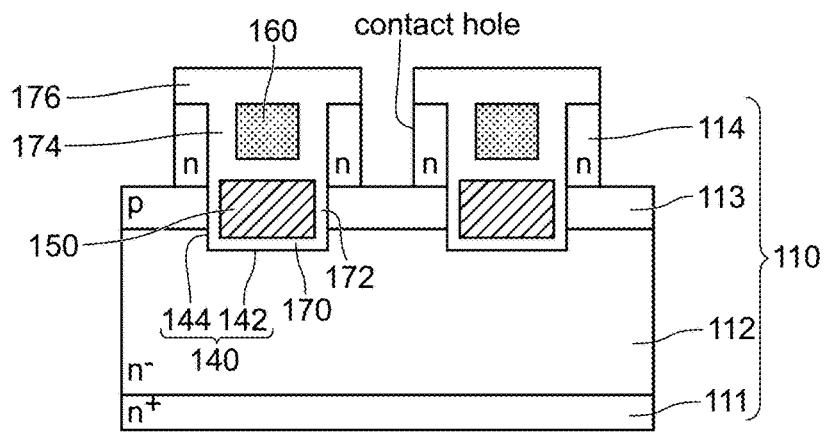

Next, a contact hole is formed between the trenches 140 disposed adjacently to each other in a state where the contact hole penetrates the third insulation region 176 and the source region 114 and reaches the base region 113 (see FIG. 6D). In this step, in the peripheral region A2, contact holes which bring the gate lead lines 152 formed on end portions of the gate electrodes 150 and gate fingers into contact with each other, contact holes which bring the drain lead lines 162 formed on end portions of the snubber electrode 160 and the drain fingers (drain pads) into contact with each other, and contact holes which bring the drain pads DP and the n-type semiconductor layers 117 into contact with each other are respectively formed.

Figure 7A:
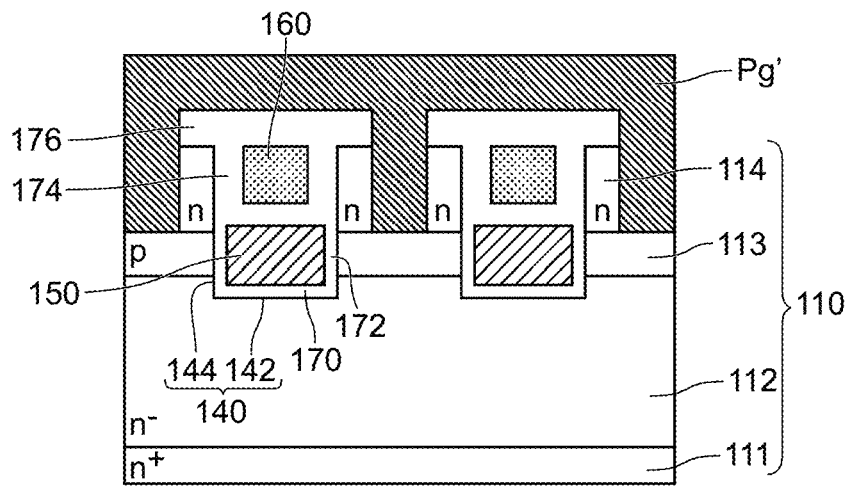

Next, a barrier metal (not shown) is formed on an inner peripheral surface of each contact hole by a sputtering method, and a film made of tungsten is formed on the inner peripheral surface of each contact hole by way of the barrier metal (see FIG. 7A). Next, tungsten is left only in the respective contact holes by a CMP method thus forming metal plugs Pg in the contact holes respectively (see FIG. 7B).

(10) Source Electrode and Drain Electrode Forming Step

Figure 7B:
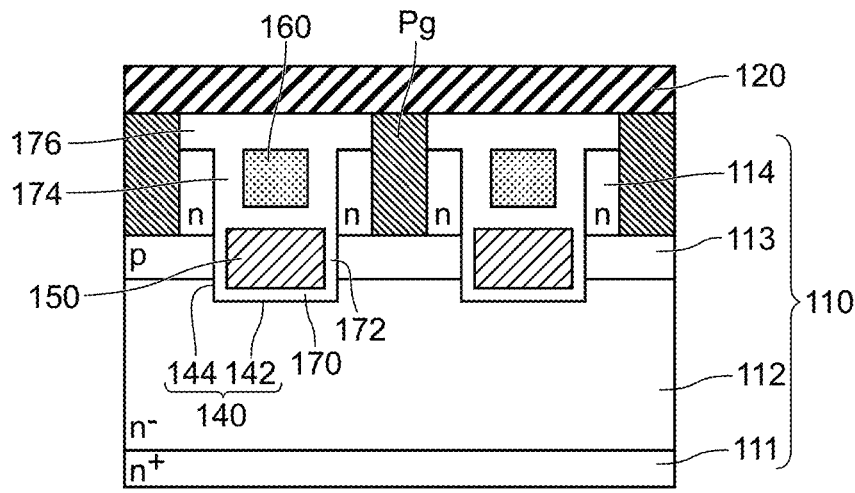
Figure 7C:
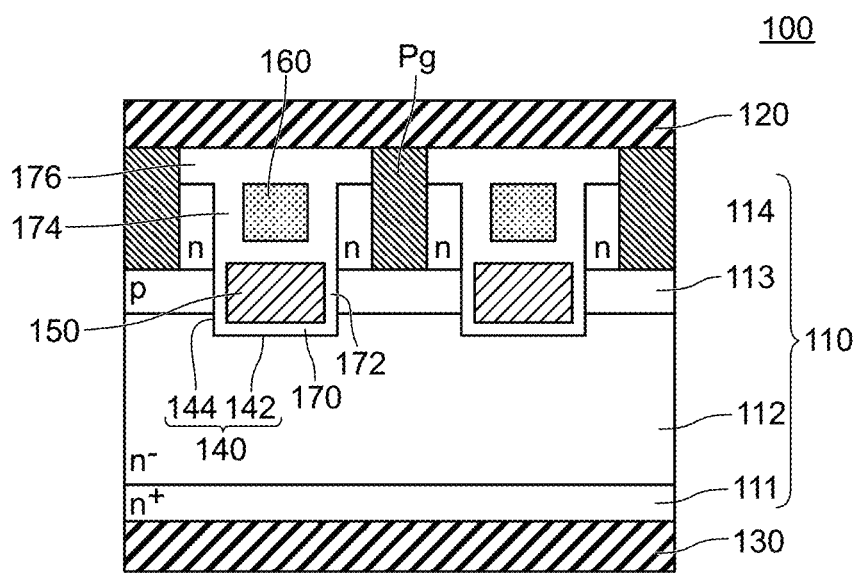

Next, an Al—Cu based metal film is formed on surfaces of the third insulation region 176 and the metal plugs Pg by a sputtering method, and a source electrode 120, the drain pad DP and the drain fingers DF, and the gate pad GP and gate fingers GF are formed (see FIG. 7B). Accordingly, the source electrode 120 is electrically connected to the source region 114 and the base region 113 via the metal plugs Pg, the drain fingers DF and the drain pad DP are electrically connected to the snubber electrodes 160 via the metal plug Pg, and the gate fingers GF and the gate pad GP are connected to gate electrodes 150 via the metal plugs Pg. A multi-layered metal film formed of a Ti layer, an Ni layer, and an Au layer (or an Ag layer) or the like is formed on the surface of the low-resistance semiconductor layer 111 thus forming a drain electrode 130 (see FIG. 7C). In the peripheral region, the drain electrode 130 is connected to the drain pad DP via the n-type semiconductor layers 117 and the metal plugs Pg. Accordingly, in a state where the drain electrode 130 is formed, the snubber electrodes 160 are connected to the drain electrode 130 via the drain lead line 162, the drain finger DF, the drain pad DP, and the semiconductor substrate 110 (drift layer 112).

The semiconductor device according to the embodiment 1 is manufactured in accordance with the above-mentioned steps.

4. Comparison Between Semiconductor Device of Present Invention and Semiconductor Device Having Shield Gate Structure As a semiconductor device where two or more kinds of electrodes are disposed in a trench, there has been known a semiconductor device having a shield gate structure (for example, a semiconductor device 800 according to a comparative example, see FIG. 8).

Figure 8:
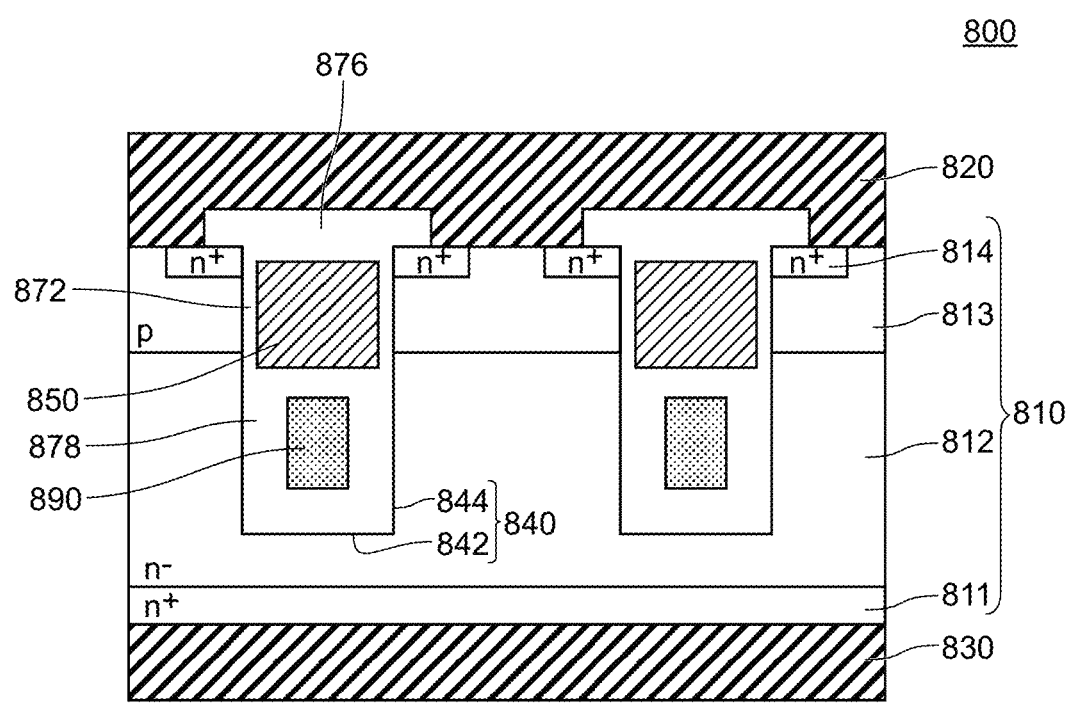
FIG. 8 is a view showing a semiconductor device 800 according to a comparative example.

As shown in FIG. 8, the semiconductor device 800 according to the comparative example includes a semiconductor substrate 810, trenches 840, gate electrodes 850, gate insulation films 872, shield electrodes 890, insulation regions 878, a source electrode 820, a drain electrode 830, and interlayer insulation films 876.

The semiconductor substrate 810 has an n-type low-resistance semiconductor layer 811, an n-type drift layer 812 disposed adjacently to the low-resistance semiconductor layer 811, a p-type base region 813 disposed adjacently to the drift layer 812, and an n-type source region 814 disposed adjacently to the base region 813.

The gate electrode 850 is disposed in the trench 840. Side wall portions of the gate electrode 850 face the base region 813 by way of the gate insulation films 872.

A shield electrode 890 is disposed in the trench 840, and is positioned below the gate electrode 850.

The insulation region 878 expands between the gate electrode 850 and the shield electrode 890, and expands along the side walls and a bottom of the trench 840 so as to make the shield electrode 890 spaced apart from the side walls and the bottom of the trench 840.

The semiconductor device 800 according to the comparative example can be manufactured by a method described hereinafter, for example.

That is, the method of manufacturing a semiconductor device according to the comparative example includes the following steps.

Figure 9A:
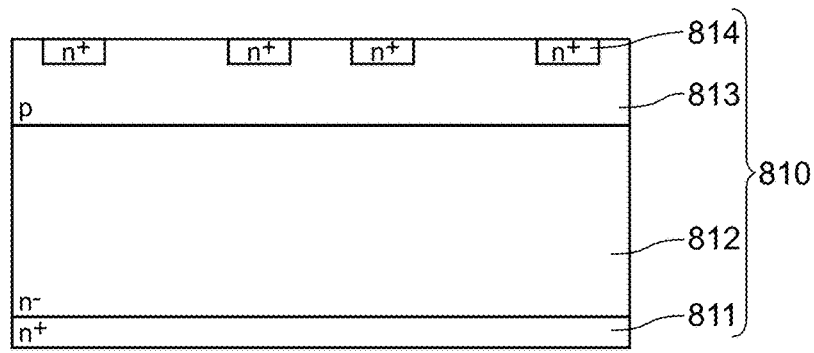

A first step of preparing the semiconductor substrate 810 (see FIG. 9A).

Figure 9B:
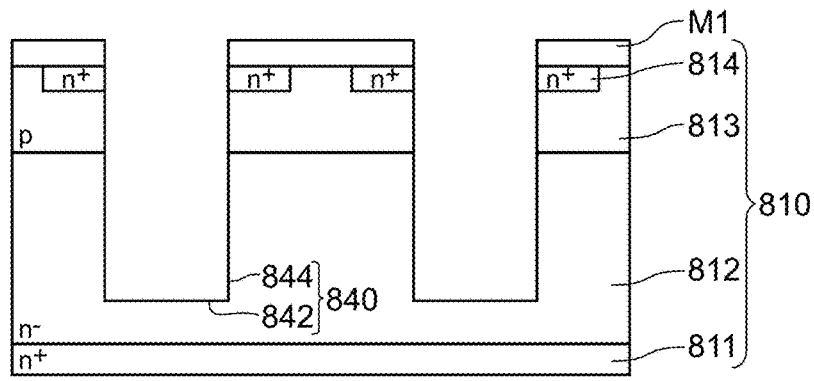

A second step of forming a plurality of trenches 840 in stripes as viewed in a plan view on the semiconductor substrate 810 (see FIG. 9B).

Figure 9C:
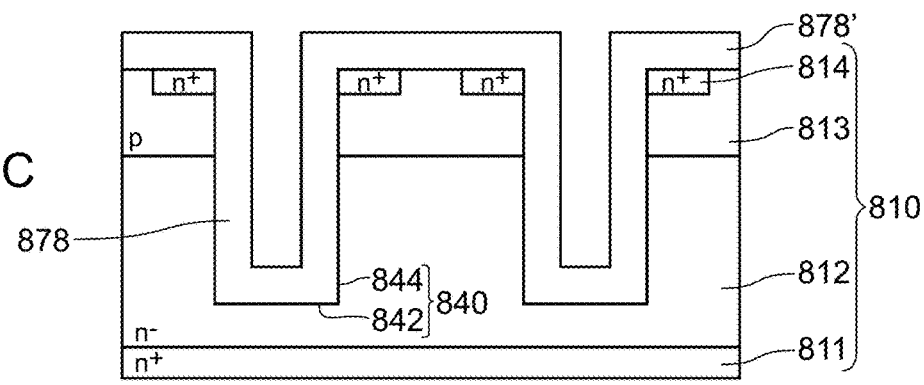

A third step of forming a first insulation film 878' on bottom surfaces and side walls of the plurality of trenches 840 (see FIG. 9C).

Figure 9D:
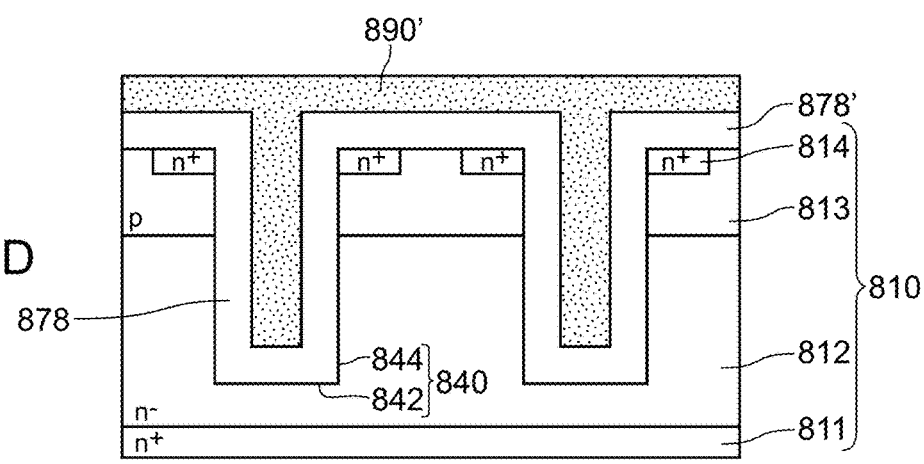
Figure 10A:
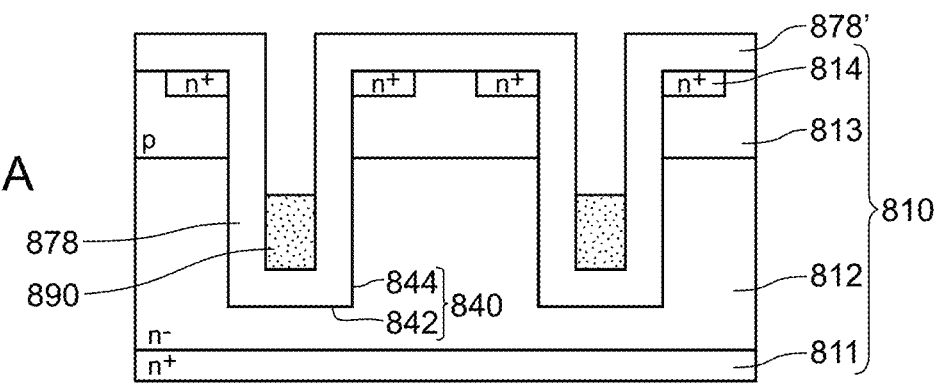

A fourth step of forming polysilicon 890' on the whole surface of the semiconductor substrate 810 on one side (see FIG. 9D), and forming shield electrodes 890 in the trenches 840 by way of the first insulation film 878' by etching the polysilicon 890' while leaving a portion of the polysilicon 890' in each trench 840 (see FIG. 10A).

Figure 10B:
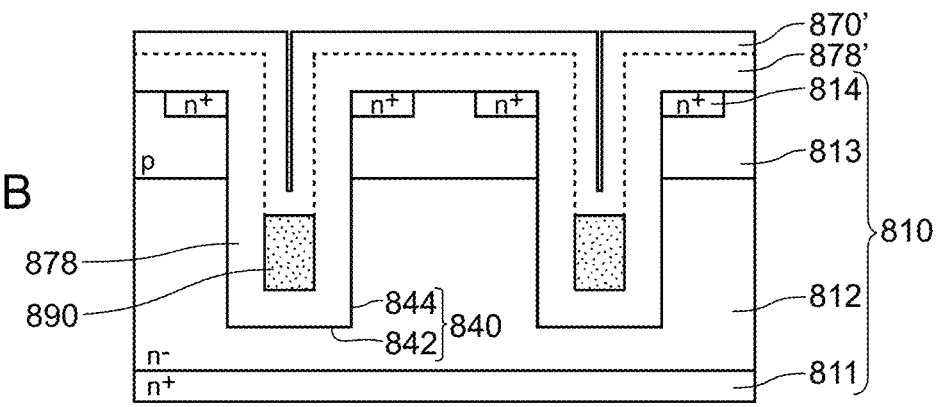

A fifth step of forming a second insulation film 870' on the whole semiconductor substrate 810 (see FIG. 10B).

Figure 10C:
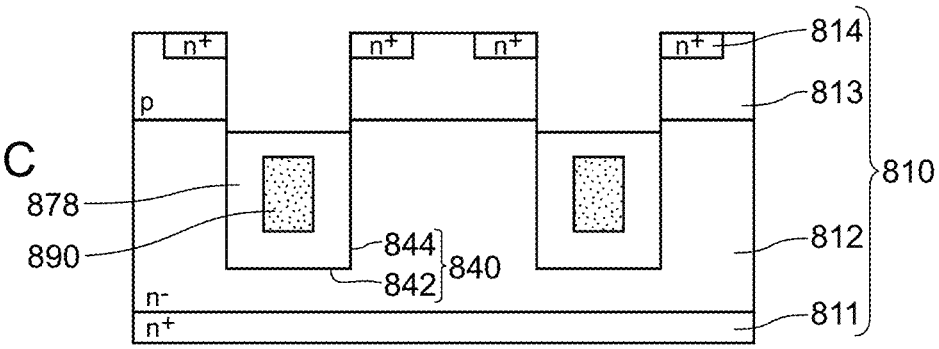

A sixth step of etching the first insulation film 878' and the second insulation film 870' while leaving the first insulation film 878' and the second insulation film 870' only on the shield electrodes 890 (see FIG. 10C).

Figure 10D:
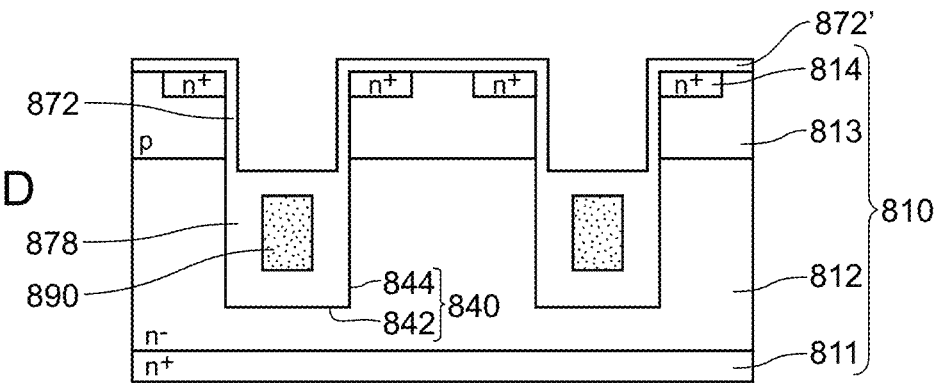

A seventh step of forming a gate insulation film 872 on side walls of an upper portion of each trench 840 by forming an insulation film 872' on the surface of the semiconductor substrate 810 on one side (including the inner surfaces of the trench 840) (see FIG. 10D).

Figure 11A:
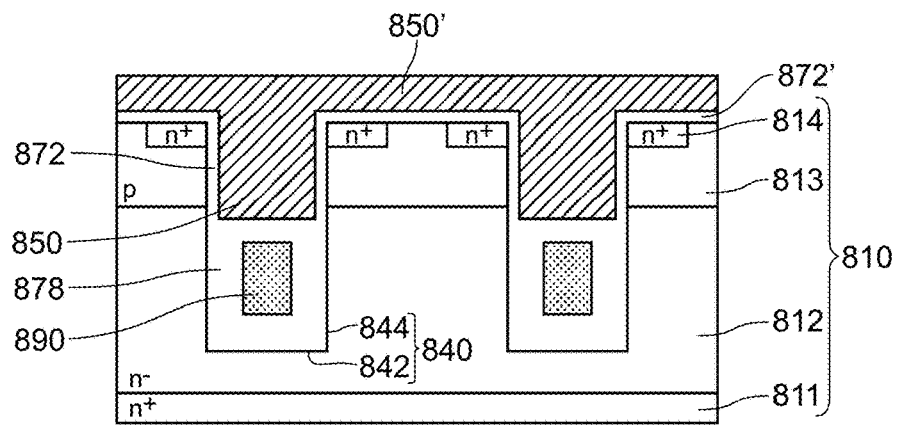
Figure 11B:
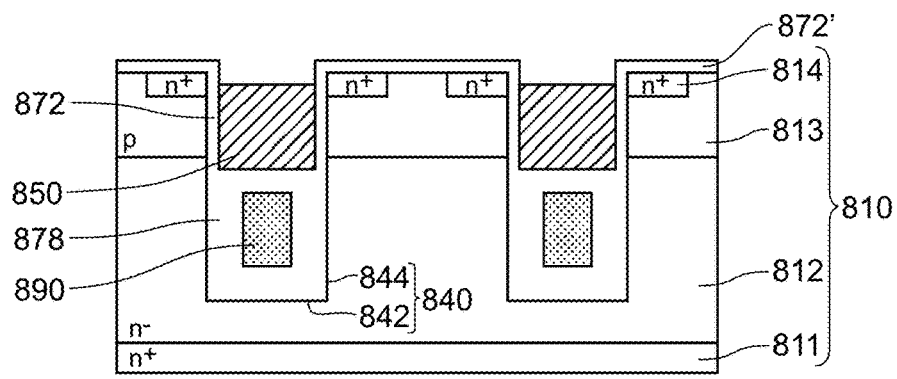

A eighth step of forming the gate electrodes 850 by forming polysilicon 850' on the surface (including surfaces of the trench 840) of the semiconductor substrate 810 on one side (see FIG. 11A), and by etching the polysilicon 850' while leaving the polysilicon 850' only in the trenches 840 (see FIG. 11B).

Figure 11C:
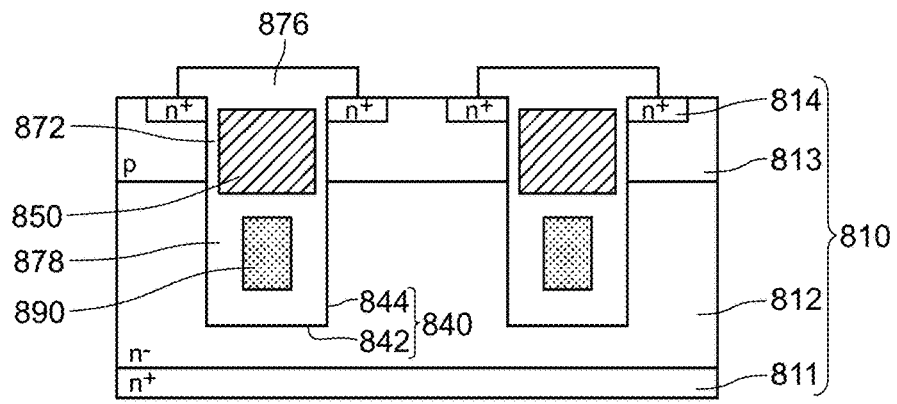

A ninth step of forming the interlayer insulation films 876 (see FIG. 11C).

Figure 11D:
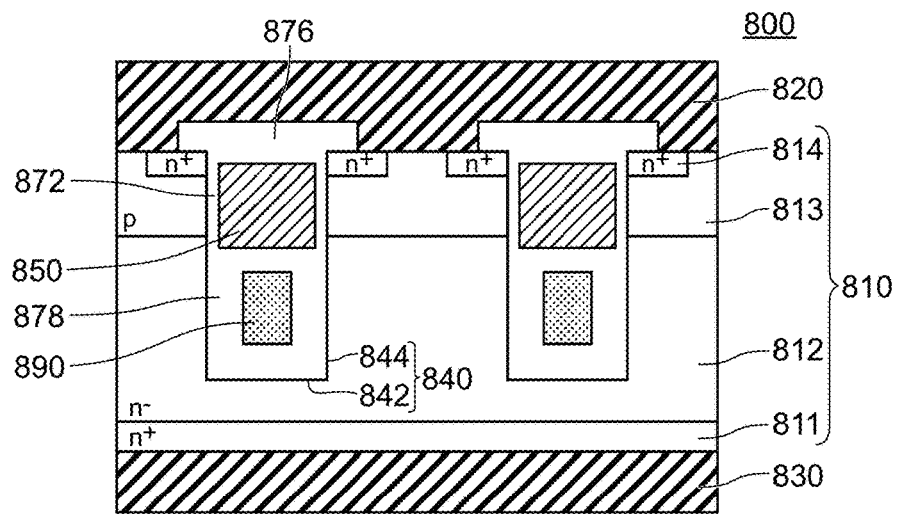

A tenth step of forming a source electrode 820 and a drain electrode 830 (see FIG. 11D).

The above-mentioned steps are performed in this order.

The gate insulation film which determines a threshold voltage of a device is required to be formed with high accuracy. In the method of manufacturing a semiconductor device according to the comparative example, the first insulation film 878' is formed in the third step (see FIG. 9C), the second insulation film 870' is formed in the fifth step (see FIG. 10B), then, the first insulation film 878' and the second insulation film 870' are etched (over-etched, see FIG. 10C) in the sixth step, and the gate insulation film 872 is formed in the seventh step (see FIG. 10D). However, in the sixth step, there is also a case where the insulation films are etched more than necessary. In such cases, it is difficult to etch the first insulation film 878' and the second insulation film 870' with high accuracy thus giving rise to a drawback that it is difficult to form the gate insulation film 872 with high accuracy.

On the other hand, according to the method of manufacturing a semiconductor device according to the embodiment 1, the gate insulation film is formed before other insulation films are formed (see FIG. 4C) and hence, the gate insulation film can be directly formed on the side walls of the trenches before other insulation films are formed. Accordingly, the gate insulation film can be formed with high accuracy.

5. Advantageous Effects Acquired by Semiconductor Device 100 and Method of Manufacturing Semiconductor Device According to Embodiment 1

According to the semiconductor device 100 and the method of manufacturing a semiconductor device according to the embodiment 1, the semiconductor device 100 includes the snubber electrodes 160 disposed above the gate electrodes 150 and formed in a spaced-apart manner from the gate electrodes 150, at least one of the plurality of snubber electrodes 160 (all snubber electrodes 160 in the embodiment 1) is connected to the drain electrode 130. Accordingly, it is possible to form the snubber circuit where a parasitic capacitance between the snubber electrodes 160 and the source regions 114 is used as a capacitor (a portion of the capacitor), and an internal resistance of the snubber electrode 160 itself is used as a resistance. Accordingly, in assembling the semiconductor device into a power conversion circuit, it is unnecessary to additionally mount the snubber circuit. As a result, it is unnecessary to ensure a region for mounting the snubber circuit and hence, the power conversion circuit can be downsized.

According to the semiconductor device 100 and the method of manufacturing a semiconductor device according to the embodiment 1, the snubber electrodes 160 are formed in stripes as viewed in a plan view, and at least one of the plurality of snubber electrodes is connected to the drain electrode 130. Accordingly, by selecting a length (a length in the vertical direction in FIG. 1A) and a cross-sectional area of the snubber electrode 160, and also by selecting whether or not each snubber electrode 160 is set to be a drain potential, a snubber capacitance can be adjusted corresponding to electric equipment. Accordingly, it is unnecessary to redesign or remanufacture a semiconductor device where a snubber capacitance of a snubber circuit is changed corresponding to electric equipment. Accordingly, it is possible to provide a semiconductor device which incorporates a snubber circuit flexibly applicable to various electric equipment.

According to the method of manufacturing a semiconductor device according to the embodiment 1, the method includes the first insulation film forming step in which the gate insulation film 172 is formed before other insulation films are formed after the trench forming step is performed (see FIG. 4C). Accordingly, the gate insulation film 172 can be directly formed on the side walls 144 of the trenches 140 before other insulation films are formed. Accordingly, the gate insulation film 172 which is required to exhibit high uniformity in film thickness can be formed with high accuracy without being affected by etching accuracies of other insulation films.

In an attempt to incorporate snubber electrodes in a semiconductor device, it is necessary to additionally prepare a region in which a snubber circuit is formed. Accordingly, downsizing of the semiconductor device itself is difficult. On the other hand, in the semiconductor device 100 according to the embodiment 1, the snubber electrode 160 is disposed in the trench 140 and hence, it is unnecessary to additionally prepare a region for forming a snubber circuit. As a result, although the semiconductor device incorporates the snubber circuit, the semiconductor device itself can be downsized.

Further, in the semiconductor device 100 according to the embodiment 1, the snubber electrode 160 is disposed at the position where the snubber electrode 160 faces the source region 114 with the second insulation region 174 sandwiched between the snubber electrode 160 and the source region 114. Accordingly, an electrostatic capacitance $C_{DS1}$ can be formed between the snubber electrode 160 and the source region 114 and hence, the electrostatic capacitance $C_{DS1}$ can be easily adjusted by adjusting a thickness of the second insulation region 174 between the snubber electrode 160 and the side wall 144 of the trench 140. As a result, in the semiconductor device 100 according to the embodiment 1, a snubber capacitance can be adjusted corresponding to electric equipment, and it is possible to provide a semiconductor device which incorporates a snubber circuit flexibly applicable corresponding to various electronic equipment.

In the semiconductor device 100 according to the embodiment 1, a thickness of the second insulation region 174 disposed between the side wall 144 of the trench 140 and the snubber electrode 160 is larger than a thickness of the gate insulation film 172. Accordingly, the second insulation region 174 disposed between the side wall 144 of the trench 140 and the snubber electrode 160 can be used as a dielectric having a predetermined electrostatic capacitance suitable for forming a snubber circuit.

In the semiconductor device 100 according to the embodiment 1, the snubber electrode 160 is made of polysilicon containing a dopant at predetermined concentration. Accordingly, a resistance value of the snubber electrode 160 can be adjusted by adjusting the dopant concentration and hence, a resistance value of a snubber circuit can be set to a desired resistance value.

In the semiconductor device 100 according to the embodiment 1, the depth position of the lower surface of the snubber electrode 160 is shallower than the depth position of the lowermost portion of the contact surface between the source region 114 and the trench 140 and hence, the whole side surfaces of the snubber electrode 160 face the source region 114. Accordingly, the area S2 of the region where the snubber electrode 160 and the source region 114 face each other can be increased and hence, an electrostatic capacitance $C_{DS1}$ between the snubber electrode 160 and the source region 114 can be increased whereby an electrostatic capacitance necessary for forming a snubber circuit can be ensured.

Embodiment 2

A semiconductor device 101 according to an embodiment 2 basically has substantially the same configuration as the semiconductor device 100 according to the embodiment 1. However, the semiconductor device 101 according to the embodiment 2 differs from the semiconductor device 100 according to the embodiment 1 with respect to the number of snubber electrodes connected to a drain electrode differs from the number of snubber electrodes connected to the drain electrode. That is, in the semiconductor device 101 according to the embodiment 2, unlike the embodiment 1 where all of the plurality of snubber electrodes 160 are connected to the drain electrode 130, some (a predetermined number of) of the plurality of snubber electrodes 160 are connected to the drain electrode 130 (see FIG. 12).

Figure 12:
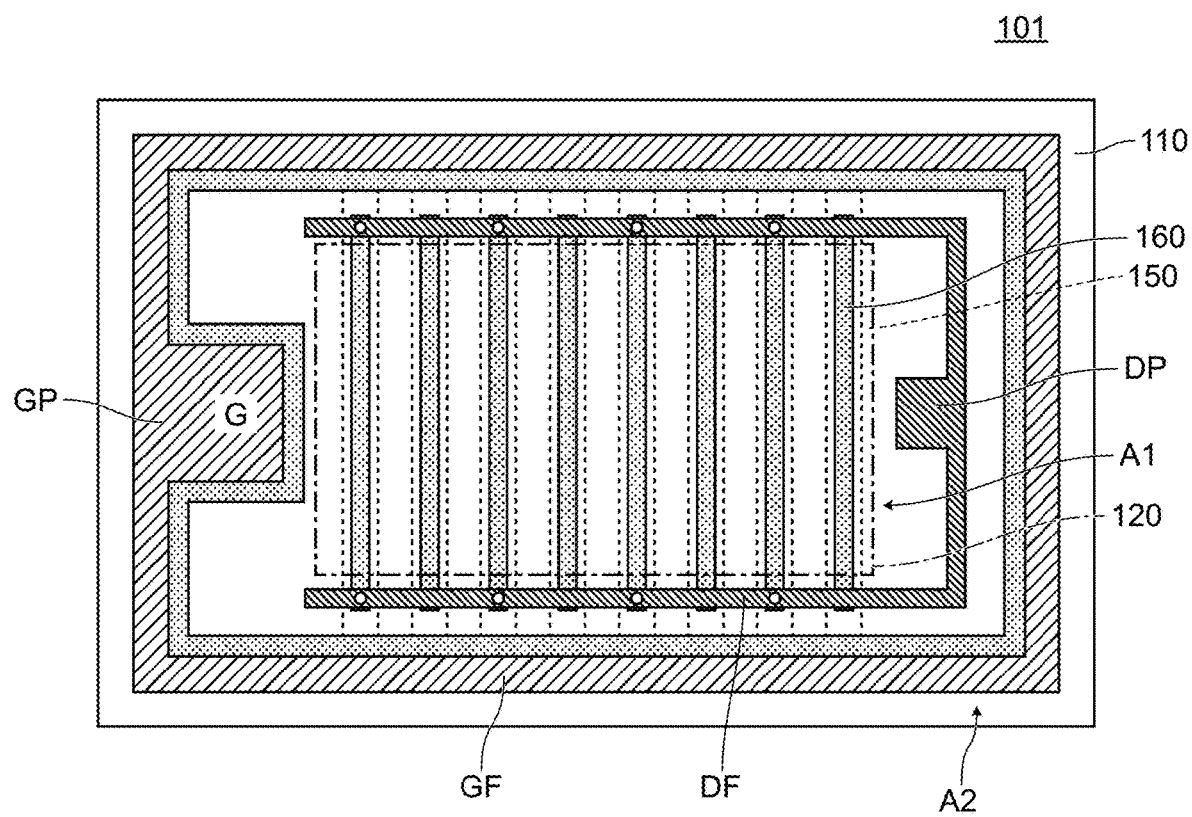
FIG. 12 is a view for describing a semiconductor device 101 according to an embodiment 2.

In the embodiment 2, a half of the plurality of snubber electrodes 160 (every other snubber electrodes 160 arranged in stripes) are connected to a drain finger DF (see white dots on the drain finger DF in FIG. 12). The remaining snubber electrodes 160 are not in contact with the drain finger DF. In the embodiment 2, the half of the plurality of snubber electrodes 160 are in contact with the drain finger DF. However, the number of snubber electrodes 160 which are in contact with the drain finger DF can be set more than or less than the half of the plurality of snubber electrodes 160. In this manner, a snubber capacitance (resistance value and electrostatic capacitance) of a snubber circuit can be easily adjusted.

In this manner, the semiconductor device 101 according to the embodiment 2 differs from the semiconductor device 100 according to the embodiment 1 with respect to the number of snubber electrodes connected to the drain electrode. However, in the same manner as the semiconductor device 100 according to the embodiment 1, at least one (the half in the embodiment 2) of the plurality of snubber electrodes 160 are connected to the drain electrode. Accordingly, the semiconductor device 101 according to the embodiment 2 becomes a semiconductor device which incorporates the snubber circuit and can realize downsizing of a power conversion circuit. Further, a snubber capacitance can be adjusted to a value corresponding to electric equipment by selecting a length and a cross-sectional area of the snubber electrode 160 and by selecting whether or not the respective snubber electrodes 160 are set to a drain potential. Accordingly, it is possible to provide a semiconductor device which incorporates a snubber circuit flexibly applicable to various electric equipment.

In the semiconductor device 101 according to the embodiment 2, only the predetermined number of snubber electrodes 160 are connected to the drain electrode 130 among the plurality of snubber electrodes 160 and hence, a resistance value and an electrostatic capacitance of the snubber circuit can be adjusted by adjusting the number of snubber electrodes 160 connected to the drain electrode 130. Accordingly, the semiconductor device 101 according to the embodiment 2 becomes a semiconductor device which incorporates a snubber circuit applicable to various electric equipment.

The semiconductor device 101 according to the embodiment 2 has substantially the same configuration as the semiconductor device 100 according to the embodiment 1 with respect to the points except for the number of snubber electrodes connected to the drain electrode. Accordingly, the semiconductor device 101 according to the embodiment 2 directly acquires the corresponding advantageous effects found amongst all advantageous effects which the semiconductor device 100 according to the embodiment 1 acquires.

[Modification 1]

Figure 13A:
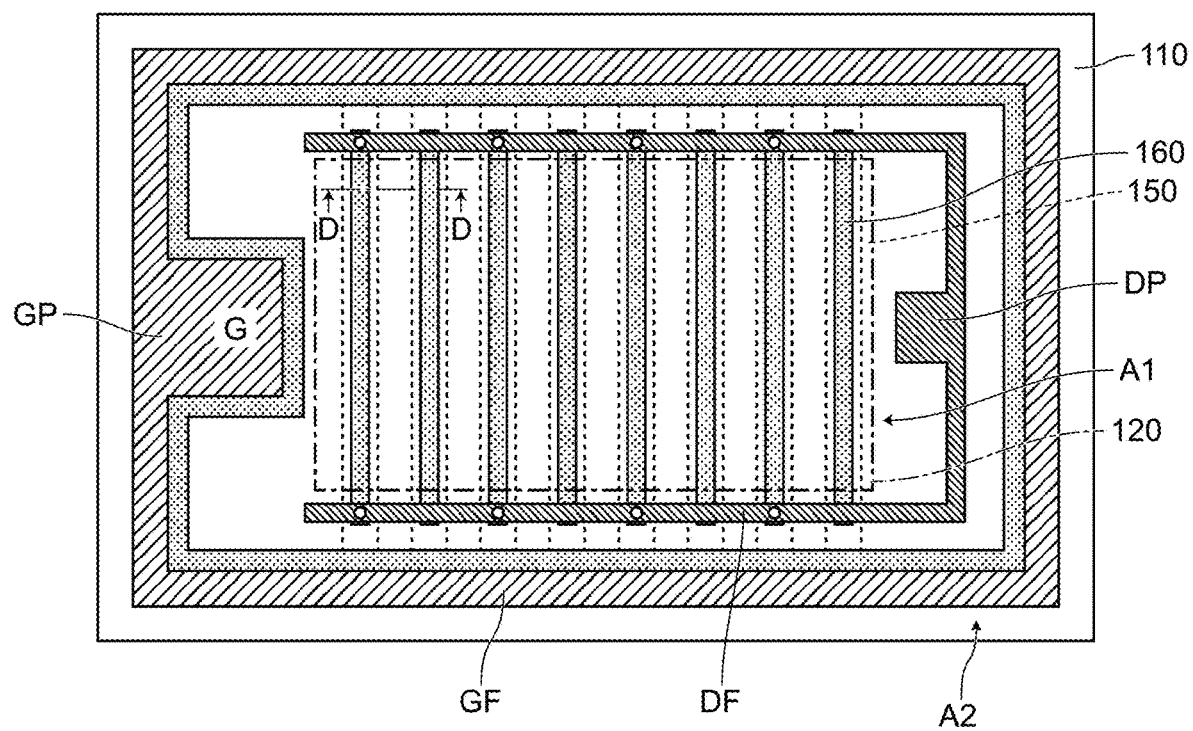
Figure 13B:
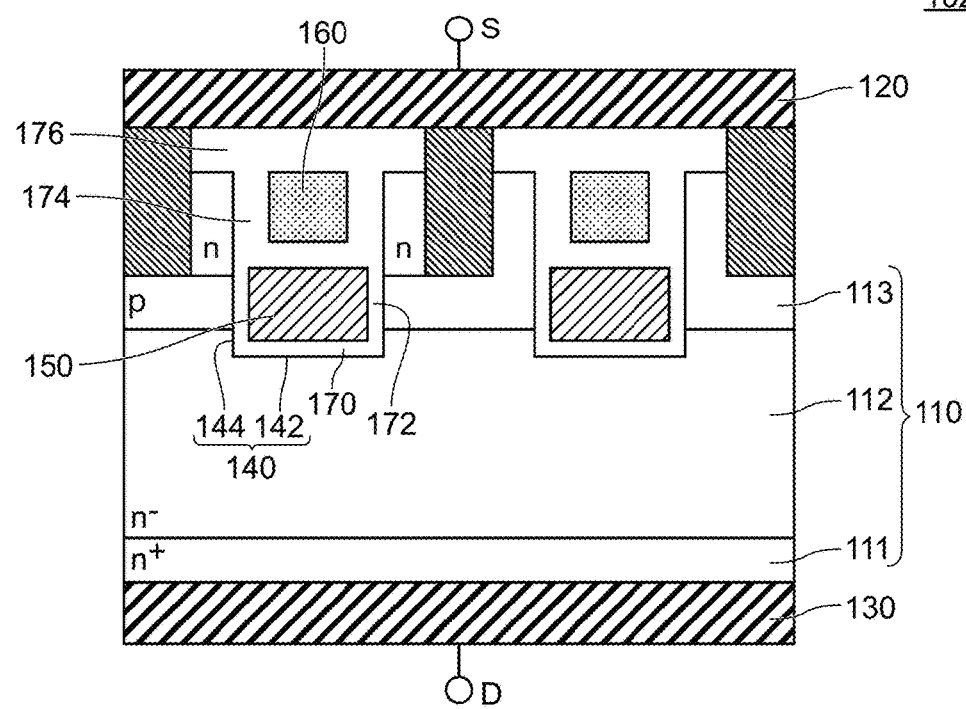

A semiconductor device 102 according to a modification 1 basically has substantially the same configuration as the semiconductor device 101 according to the embodiment 2. However, the semiconductor device 102 according to the modification 1 differs from the semiconductor device 101 according to the embodiment 2 with respect to the configuration of source regions (see FIG. 13A and FIG. 13B). That is, in the modification 1, source regions 114 are not formed on a periphery of a trench 140 (see the trench 140 on a right side in FIG. 13B) which embraces the snubber electrode 160 which is not brought into contact with a drain finger DF (drain electrode), and the source regions 114 are formed on a periphery of a trench 140 (see the trench 140 on a left side in FIG. 13B) which embraces the snubber electrodes 160 which are brought into contact with the drain finger DF (drain electrode).

In this manner, the semiconductor device 102 according to the modification 1 differs from the semiconductor device 101 according to the embodiment 2 with respect to the configuration of the source regions. However, in the same manner as the semiconductor device 102 according to the embodiment 2, at least one (a half in the modification 1) of the plurality of snubber electrodes 160 are connected to the drain electrode. Accordingly, the semiconductor device 102 according to the modification 1 becomes a semiconductor device which incorporates a snubber circuit, and can realize downsizing of a power conversion circuit. Further, it is unnecessary to redesign or remanufacture a semiconductor device where a snubber capacitance of a snubber circuit is changed corresponding to electric equipment. Accordingly, it is possible to provide a semiconductor device which incorporates a snubber circuit flexibly applicable to various electric equipment.

In the trench 140 having the snubber electrode 160 which is connected to the drain electrode 130, a depletion layer extends toward a depth position deeper than the trench 140 in a depth direction. However, also in the trench 140 (see the trench on the right side in FIG. 13B) having the snubber electrode 160 which is not connected to the drain electrode 130, the depletion layer can be maintained at the deep depth position. Accordingly, although such a trench 140 does not have a function as a gate trench, the trench 140 functions as a so-called dummy trench.

[Modification 2]

Figure 14A:
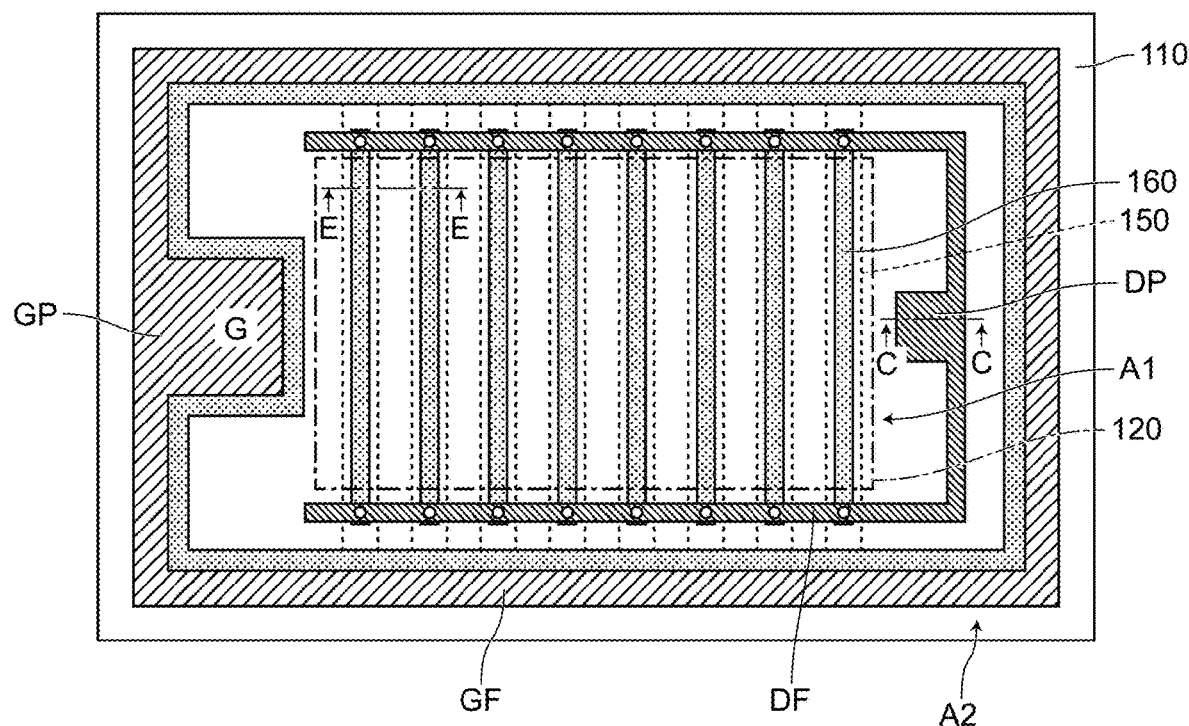
Figure 14B:
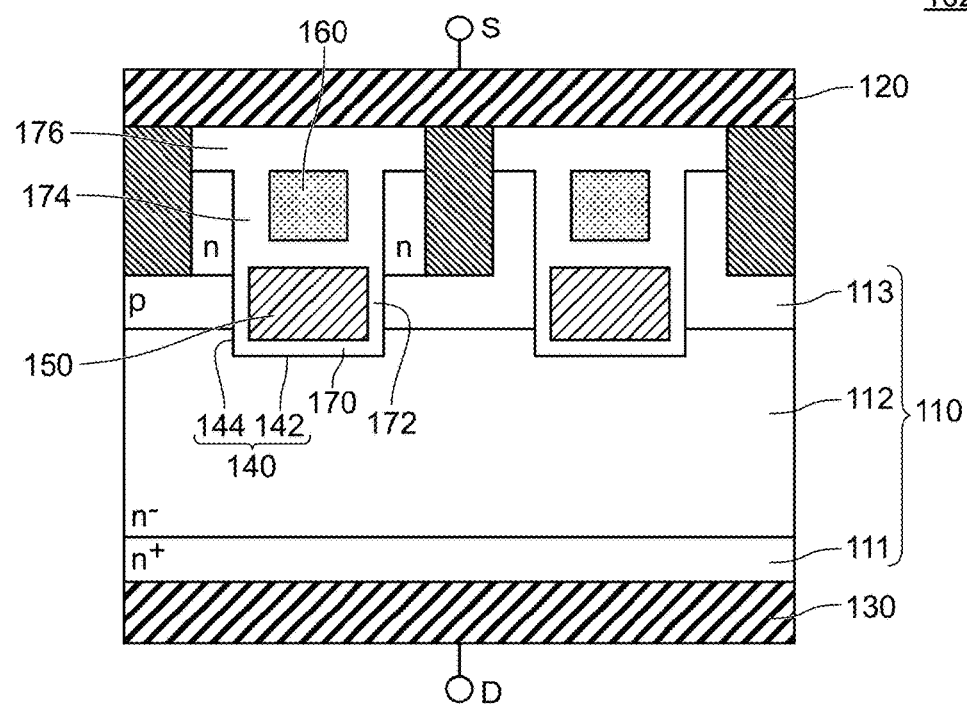

A semiconductor device 102a according to a modification 2 basically has substantially the same configuration as the semiconductor device 102 according to the modification 1. However, the semiconductor device 102a according to the modification 2 differs from the semiconductor device 102 according to the modification 1 with respect to the number of snubber electrode which are brought into contact with a drain finger. That is, in the modification 2, all snubber electrodes 160 are connected to the drain finger DF (see FIG. 14A). In such a configuration, although a trench 140 around which source regions 114 are not formed (see the trench on a right side in FIG. 14B) does not have a function as a gate trench, the trench 140 has a function as a snubber circuit and as a so-called dummy trench. Also in the modification 2, the number of snubber electrodes connected to the drain finger and the number of trenches around which source regions are not formed can be arbitrarily adjusted.

In this manner, the semiconductor device 102a according to the modification 2 differs from the semiconductor device 102 according to the modification 1 with respect to the number of snubber electrodes which are brought into contact with the drain finger. However, in the same manner as the semiconductor device 102 according to the modification 1, at least one (a half in the modification 2) of the plurality of snubber electrodes 160 are connected to the drain electrode. Accordingly, the semiconductor device 102a according to the modification 2 becomes a semiconductor device which incorporates the snubber circuit and can realize downsizing of a power conversion circuit. Further, it is unnecessary to redesign or remanufacture a semiconductor device where a snubber capacitance of a snubber circuit is changed corresponding to electric equipment. Accordingly, it is possible to provide a semiconductor device which incorporates a snubber circuit flexibly applicable to various electric equipment.

Embodiment 3

Figure 15:
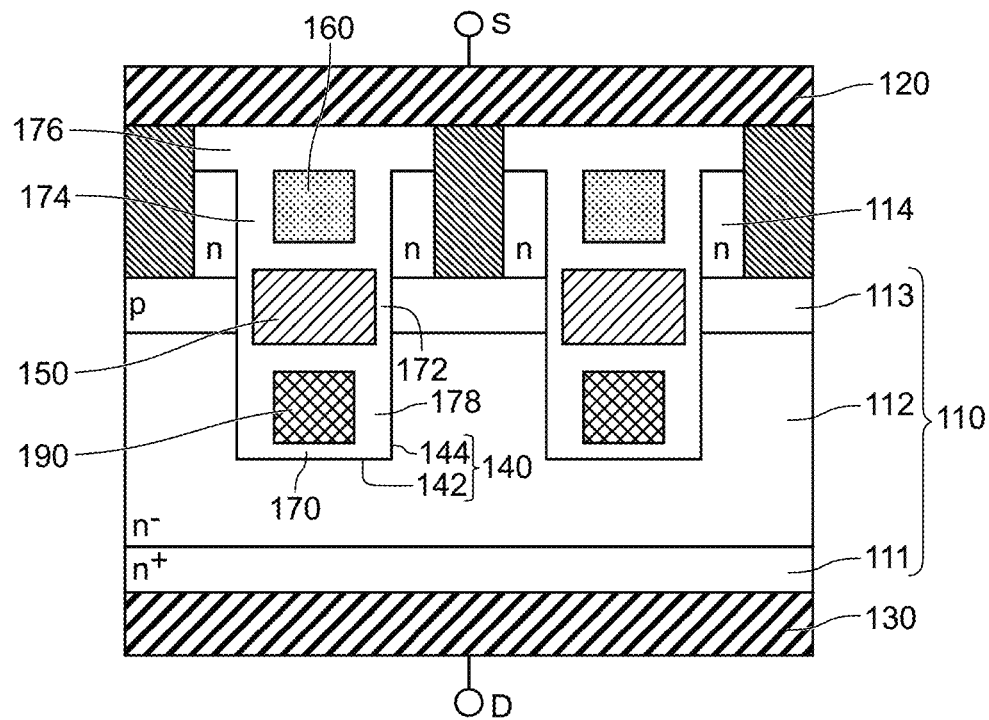
FIG. 15 is a view for describing a semiconductor device 103 according to an embodiment 3.

A semiconductor device 103 according to an embodiment 3 basically has substantially the same configuration as the semiconductor device 100 according to the embodiment 1 or the semiconductor device 101 according to the embodiment 2 (hereinafter referred to as the semiconductor device 100 according to the embodiment 1 or the like). However, the semiconductor device 103 according to the embodiment 3 differs from the semiconductor device 100 according to the embodiment 1 or the like with respect to a point that the semiconductor device 103 according to the embodiment 3 has a shield gate structure. That is, the semiconductor device 103 according to the embodiment 3 is a semiconductor device having shield electrodes 190 (a semiconductor device having a shield gate structure) (see FIG. 15). The shield electrode 190 is disposed in a trench 140, is disposed between a gate electrode 150 and a bottom of the trench 140, is spaced apart from the trench 140 and a source electrode 120, and is connected to a source electrode 120 (or a gate electrode). In the embodiment 3, the shield electrode 190 is connected to the source electrode. However, the shield electrode 190 may be connected to the gate electrode. In this case, the shield electrode 190 and the gate electrode 150 are spaced apart from each other in the trench 140, and are electrically connected to each other via a gate finger GF disposed outside the trench 140.

In the embodiment 3, the semiconductor device 103 includes fourth insulation regions 178. The fourth insulation region 178 expands between the shield electrode 190 and the gate electrode 150 so as to make the gate electrode 150 spaced apart from the shield electrode 190, and the fourth insulation region 178 expands between the gate electrode 150 and the side walls 144 of the trench 140 so as to make the gate electrode 150 spaced apart from the side walls 144 of the trench 140.

In this manner, the semiconductor device 103 according to the embodiment 3 differs from the semiconductor device 100 according to the embodiment 1 or the like with respect to a point that the semiconductor device 103 according to the embodiment 3 has the shield gate structure. However, in the same manner as the semiconductor device 100 according to the embodiment 1 or the like, at least one of the plurality of snubber electrodes 160 is connected to the drain electrode. Accordingly, the semiconductor device 103 according to the embodiment 3 becomes a semiconductor device which incorporates a snubber circuit and can realize downsizing of a power conversion circuit. Further, a snubber capacitance can be adjusted to a value corresponding to electric equipment by selecting a length and a cross-sectional area of the snubber electrode 160 and by selecting whether or not the respective snubber electrodes 160 are set to a drain potential. Accordingly, it is possible to provide a semiconductor device which incorporates a snubber circuit flexibly applicable to various electric equipment.

The semiconductor device 103 according to the embodiment 3 includes the shield electrode 190 in the trench 140. The shield electrode 190 is disposed between the gate electrode 150 and the bottom of the trench 140, is spaced apart from the bottom 142 of the trench 140, the side walls 144 of the trench 140, and a gate electrode 150, and is connected to the gate electrode 150 or the source electrode 120 and hence, gate-drain capacitance $C_{GD}$ is reduced. Accordingly, a gate charge current amount and a gate discharge current amount are reduced so that a switching speed can be increased.

Further, the semiconductor device 103 according to the embodiment 3 includes a fourth insulation region 178. The fourth insulation region 178 expands between the shield electrode 190 and the gate electrode 150 so as to make the gate electrode 150 spaced apart from the shield electrode 190, and the fourth insulation region 178 expands between the gate electrode 150 and the side walls 144 of the trench 140 so as to make the gate electrode 150 spaced apart from the side walls 144 of the trench 140. Accordingly, a distance from a corner portion of the trench 140 where electric field concentration is liable to occur to the gate electrode 150 can be increased, and an electric field can be attenuated by the fourth insulation region 178. As a result, a withstand voltage of the semiconductor device 103 according to the embodiment 3 can be increased.

The semiconductor device 103 according to the embodiment 3 has substantially the same configuration as the semiconductor device 100 according to the embodiment 1 or the like with respect to the points except for the point that the semiconductor device 103 has the shield gate structure. Accordingly, the semiconductor device 103 according to the embodiment 3 directly acquires the corresponding advantageous effects found amongst all advantageous effects which the semiconductor device 100 according to the embodiment 1 or the like acquires.

Embodiment 4

Figure 16:
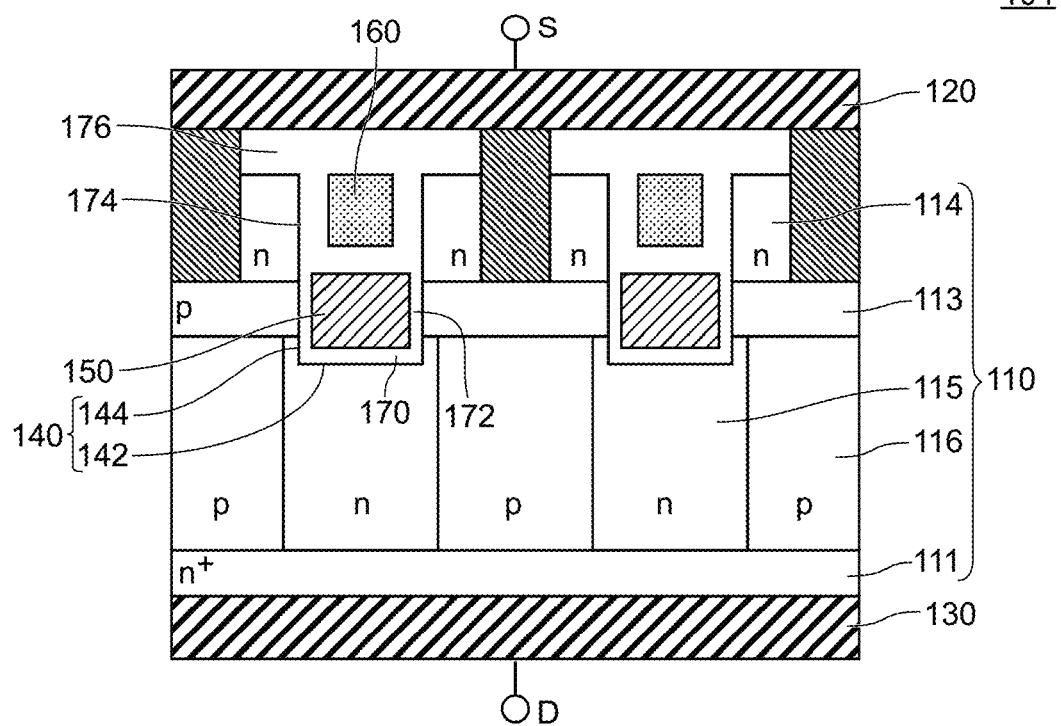
FIG. 16 is a view for describing a semiconductor device 104 according to an embodiment 4.

A semiconductor device 104 according to an embodiment 4 basically has the same configuration as the semiconductor device 100 according to the embodiment 1 or the like. However, the semiconductor device 104 according to the embodiment 4 differs from the semiconductor device 100 according to the embodiment 1 or the like with respect to a point that the semiconductor device 104 according to the embodiment 4 has a super junction structure (hereinafter referred to as SJ structure). That is, in the semiconductor device 104 according to the embodiment 4, a semiconductor substrate 110 further has a plurality of p-type column regions 116 (second conductive type column regions) which are formed at a predetermined interval in a region deeper than a bottom of a base region 113, a drift layer which is disposed between the p-type column regions 116 disposed adjacently to each other forms an n-type column region 115 (a first conductive type column region), and the n-type column region 115 and the p-type column region 116 form the SJ structure (see FIG. 16). In the embodiment 4, the n-type column region 115 is formed below the trench 140, and the n-type column region 115 has a larger width than the trench 140 for forming a channel with the source region 114. However, any suitable configuration is adopted provided that the SJ structure is formed and the channel can be formed with the source region 114.

In this manner, the semiconductor device 104 according to the embodiment 4 differs from the semiconductor device 100 according to the embodiment 1 or the like with respect to the point that the semiconductor device 104 has the SJ structure. However, in the same manner as the semiconductor device 100 according to the embodiment 1 or the like, at least one of the plurality of the snubber electrodes 160 is connected to the drain electrode. Accordingly, the semiconductor device 104 according to the embodiment 4 becomes a semiconductor device which incorporates a snubber circuit and can realize downsizing of a power conversion circuit. Further, a snubber capacitance can be adjusted to a value corresponding to electric equipment by selecting a length and a cross-sectional area of the snubber electrode 160 and by selecting whether or not the respective snubber electrodes 160 are set to a drain potential. Accordingly, it is possible to provide a semiconductor device which incorporates a snubber circuit flexibly applicable to various electric equipment.

According to the semiconductor device 104 according to the embodiment 4, the SJ structure is formed of the n-type column region 115 and the p-type column region 116 and hence, it is possible to provide a semiconductor device having small ON resistance while maintaining a withstand voltage.

The semiconductor device 104 according to the embodiment 4 has substantially the same configuration as the semiconductor device 100 according to the embodiment 1 or the like with respect to the points except for the point that the semiconductor device 104 has the SJ structure. Accordingly, the semiconductor device 104 according to the embodiment 4 directly acquires the corresponding advantageous effects found amongst all advantageous effects which the semiconductor device 100 according to the embodiment 1 or the like acquires.

The present invention has been described based on the above-mentioned embodiments heretofore, the present invention is not limited to the above-mentioned embodiments. Various modes can be carried out without departing from the gist of the present invention. For example, the following modifications are also conceivable.

(1) In the above-mentioned respective embodiments (also including the above-mentioned respective modifications), the shapes, the positions, the sizes and the like of the constitutional elements are provided only for an exemplifying purpose, and can be changed within a range that advantageous effects of the present invention are not impaired. This modification is also applicable to the following modifications (2) to (8). This modification may be combined with the above-mentioned respective embodiments.

Figure 17:
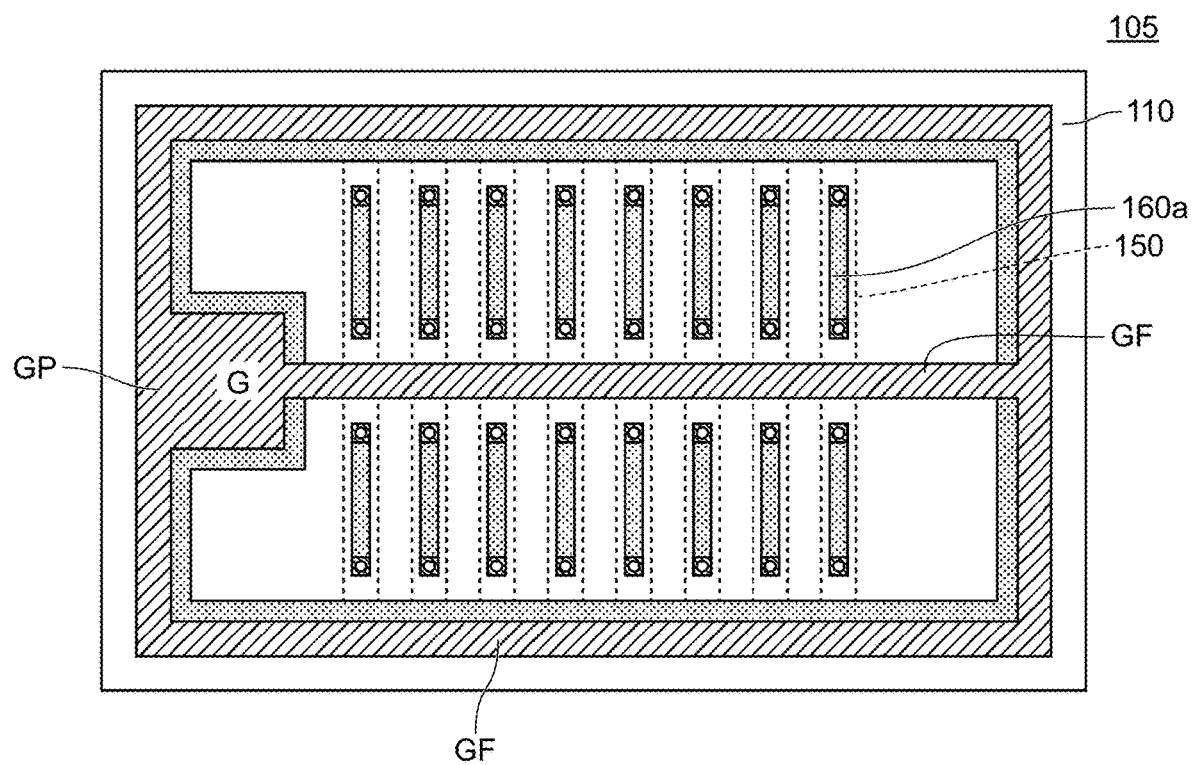
FIG. 17 is a view for describing a semiconductor device 105 according to a modification 3, wherein the illustration of a drain finger DF, a drain pad DP, and a source electrode 120 is omitted.

(2) In the above-mentioned respective embodiments, the gate finger GF is disposed only on the outer peripheral portion of the semiconductor substrate. However, the present invention is not limited to such a configuration. In addition to the outer peripheral portion, the gate finger GF may be further arranged so as to transverse the semiconductor substrate 110 from the gate pad GP to a side of the semiconductor substrate 110 opposite to the gate pad GP (see FIG. 17). In this case, the source electrode (not shown) is divided into two regions surrounded by the gate finger, and the drain finger and the drain pad (not shown) are disposed so as to surround the respective source electrodes (two in total).

Figure 18:
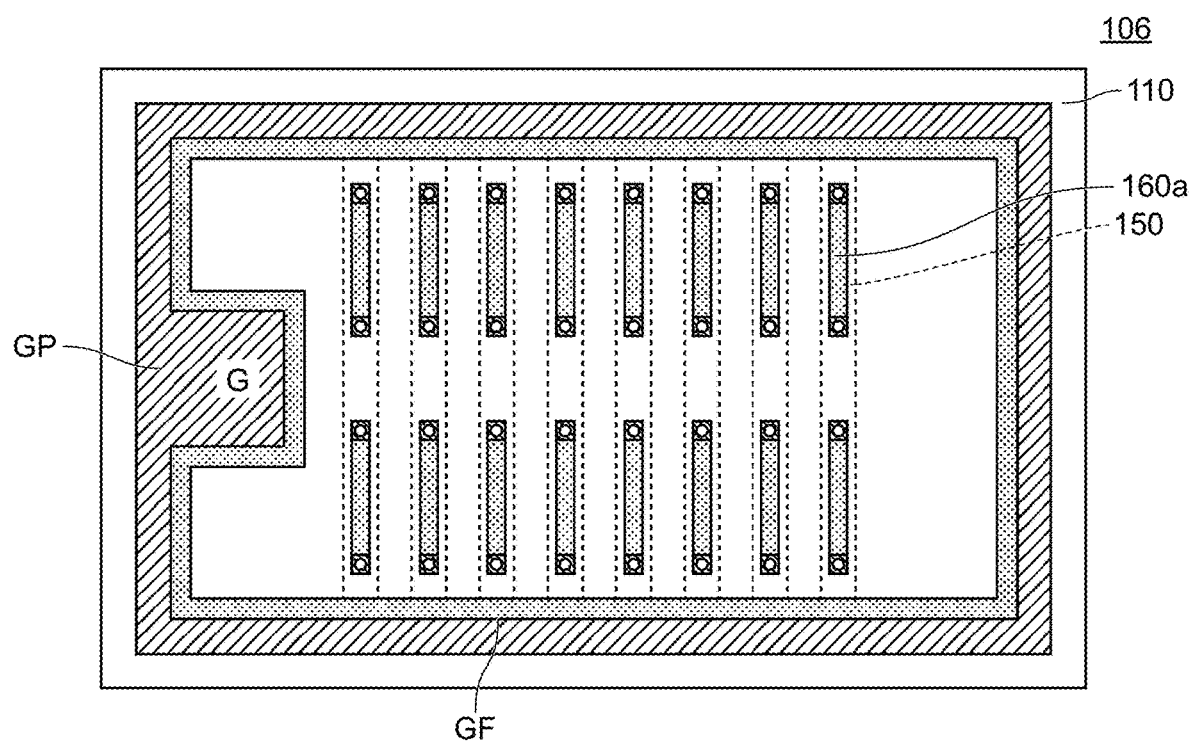
FIG. 18 is a view for describing a semiconductor device 106 according to a modification 4, wherein the illustration of a drain finger DF, a drain pad DP, and a source electrode 120a is omitted.

(3) In the above-mentioned respective embodiments, the trenches, the gate electrodes and the snubber electrodes are formed such that these constitutional elements longitudinally traverse the semiconductor substrate as viewed in a plan view. However, the present invention is not limited to such a configuration. One elongated snubber electrode having a strip shape may be disposed in a divided manner in two or more short members as viewed in a plan view (when the snubber electrode is divided in two, see symbol 160a in FIG. 18, the semiconductor device 106 according to the modification 4), and the gate electrode 150 may be divided in two or more short members, and both the snubber electrode and the gate electrode may be divided in two or more short members.

Figure 19:
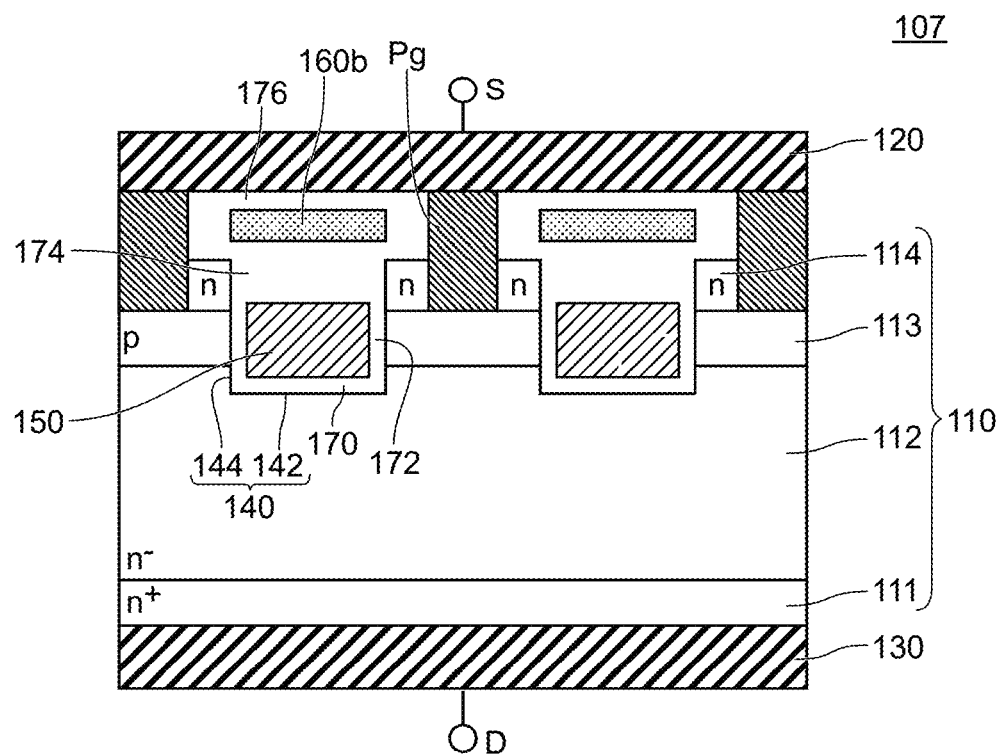
FIG. 19 is a view for describing a semiconductor device 107 according to a modification 5.
Figure 20:
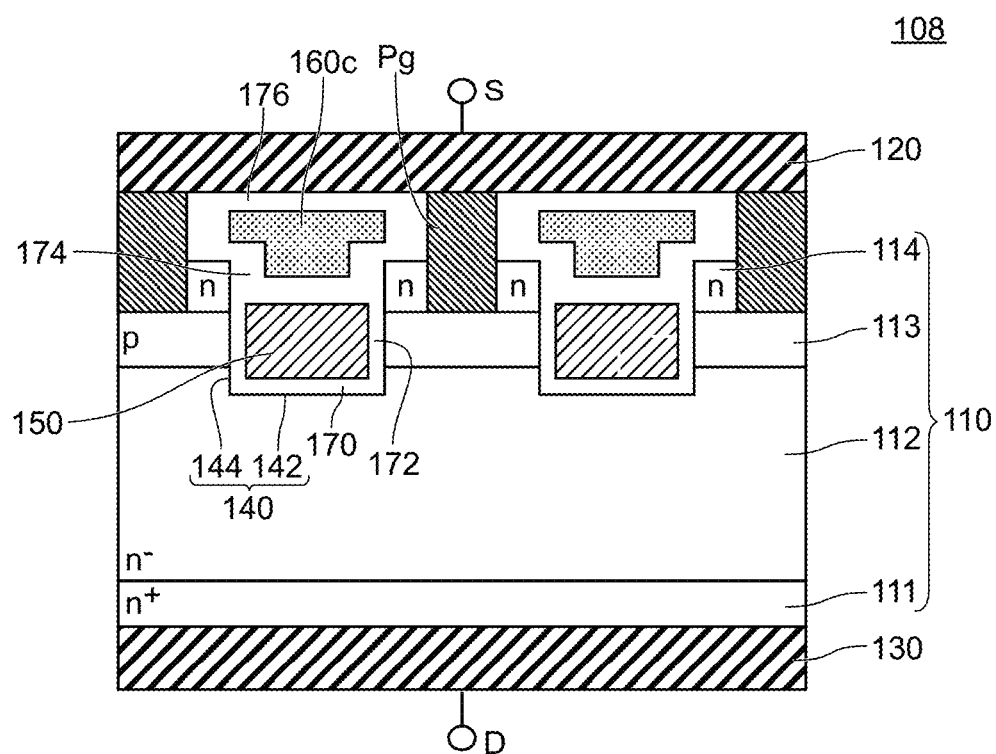
FIG. 20 is a view for describing a semiconductor device 108 according to a modification 6.

(4) In the above-mentioned respective embodiments, the snubber electrode 160 is formed in the trench 140. However, the present invention is not limited to such a configuration. A whole snubber electrode may be formed outside the trench. That is, the whole snubber electrode may be formed at a position higher than a height position of the surface of the semiconductor substrate 110 in the region where the trench is not formed (see a snubber electrode 160b shown in FIG. 19). A snubber electrode may be formed such that a portion of the snubber electrode is disposed in the trench, and other portions of the snubber electrode are disposed at a position higher than the height position of the surface of the semiconductor substrate 110 (see a snubber electrode 160c in FIG. 20).

(5) In the above-mentioned respective embodiments, the source electrode 120 is brought into contact with the source regions and the base regions using the metal plugs Pg. However, the present invention is not limited to such a configuration. A p-type diffusion semiconductor region having high concentration may be formed on the semiconductor substrate, and the source electrode 120 may be brought into contact with the source regions and the base regions. In this case, in a contact region forming step, the semiconductor substrate may not be etched, and a p-type diffusion semiconductor region may be formed by introducing a p-type dopant in the semiconductor substrate (for example, by an ion implantation method, an epitaxial growth method or the like). The p-type diffusion semiconductor region may not be particularly formed. Further, in the above-mentioned respective embodiments, an n-type dopant is injected into the whole region of a surface of the semiconductor substrate on one side by ion implantation. However, an n-type dopant can be selectively injected into the semiconductor substrate by ion implantation using masks.

Figure 21A:
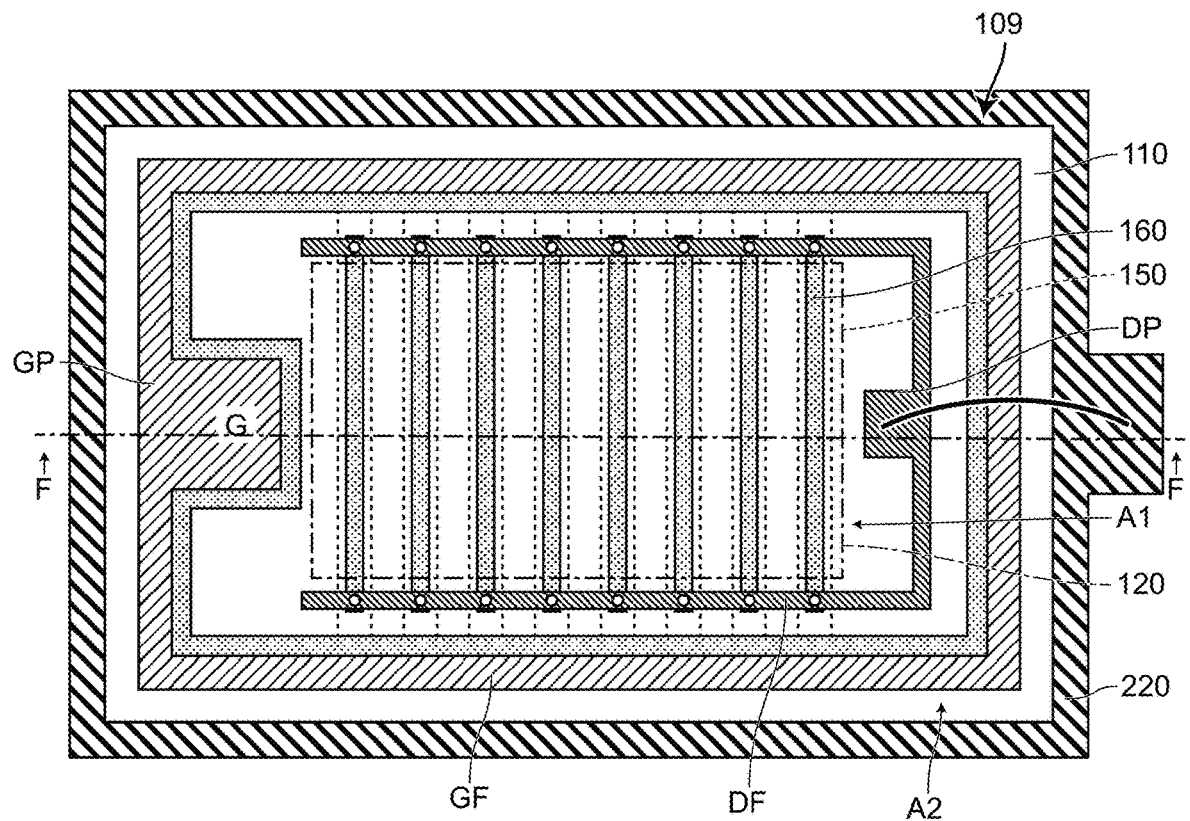
Figure 21B:
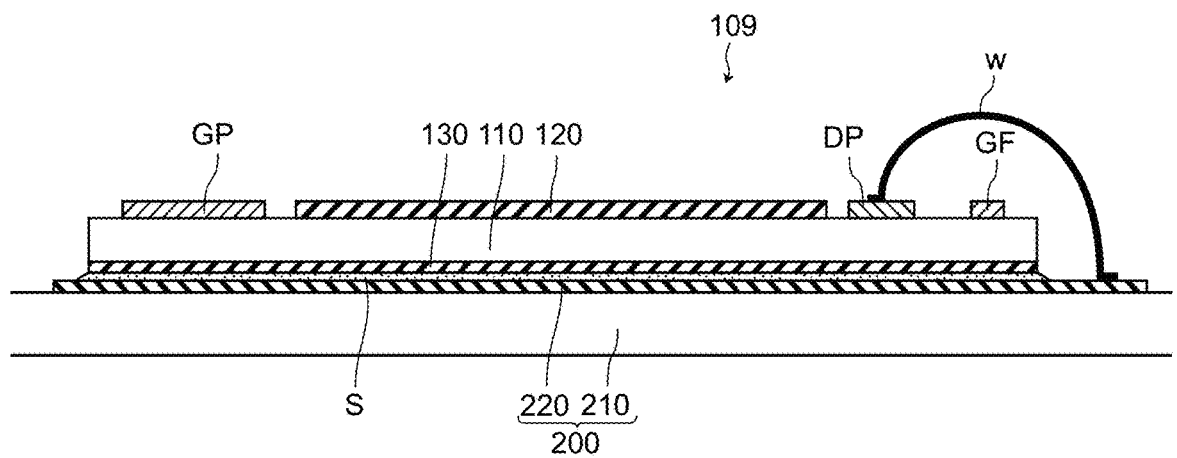
Figure 22:
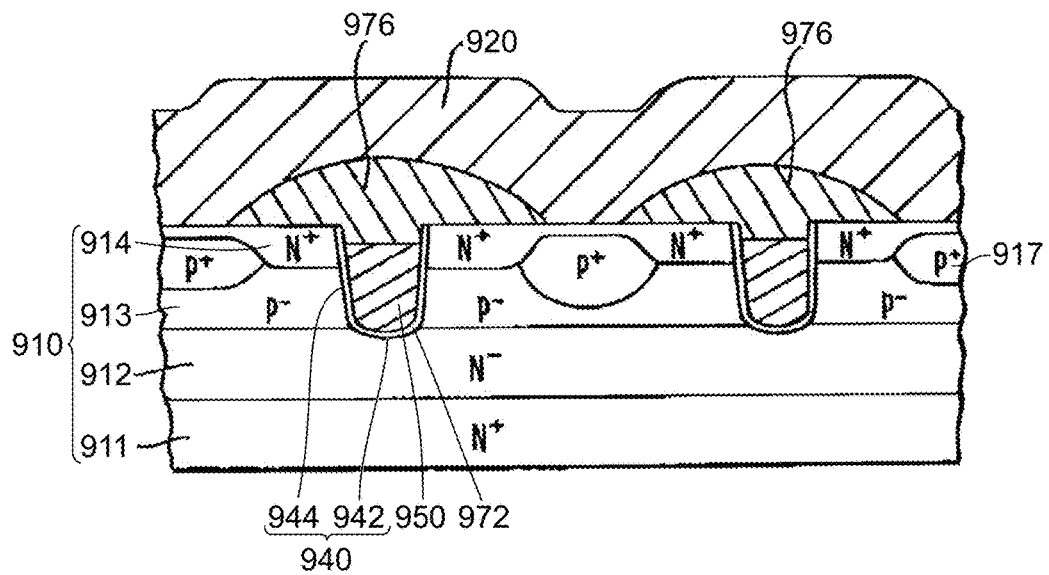
FIG. 22 is a view for describing a semiconductor device 900 described in U.S. Pat. No. 6,429,481, wherein symbol 911 indicates a low-resistance semiconductor layer, symbol 917 indicates a contact region, and symbol 976 indicates an interlayer insulation film.
Figure 23:
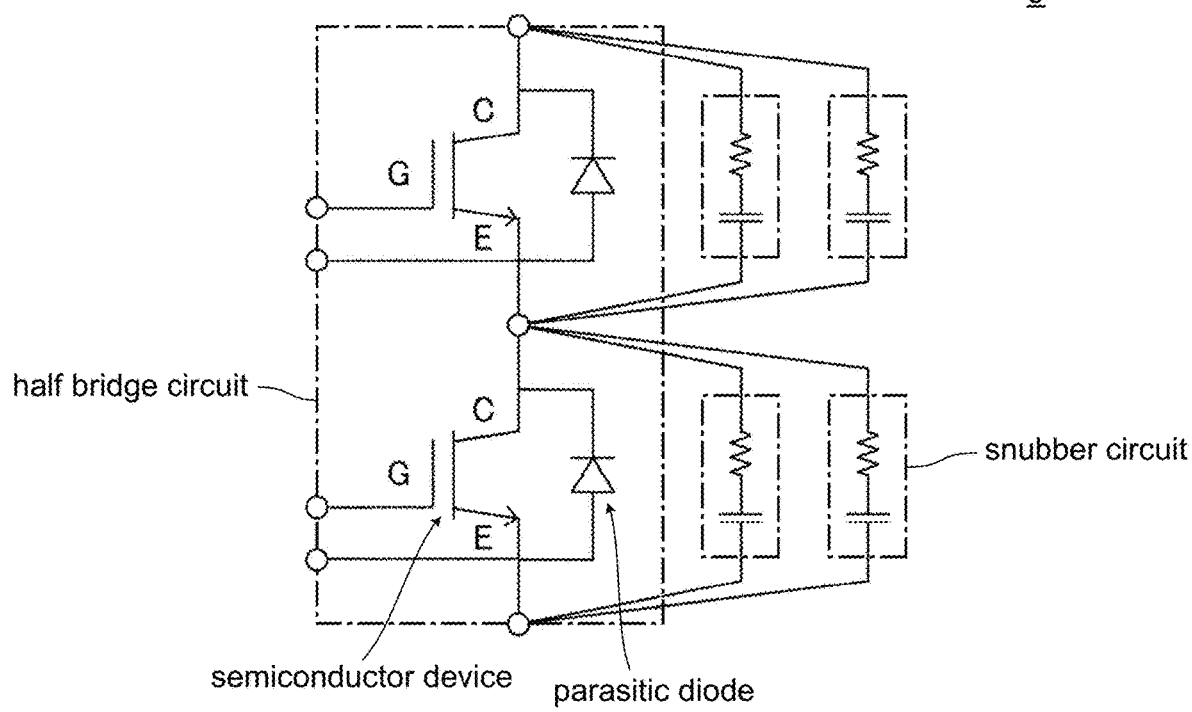
FIG. 23 is a circuit diagram showing a power conversion circuit (half bridge circuit) 9 described in International Publication No. WO 2018/012122.

(6) In the above-mentioned respective embodiments, in the peripheral region, the snubber electrodes 160 are connected to the drain electrode via the metal plugs Pg formed in the third insulation region 176 in a penetrating manner and the n-type semiconductor layer 117. However, the present invention is not limited to such a configuration. The snubber electrodes 160 may be connected to the drain electrode 130 via side surface portions of the semiconductor substrate and channel stopper electrodes (not shown). Further, a circuit board 200 which includes an insulation substrate 210 and lines 220 disposed on the insulation substrate 210 may be prepared, a semiconductor device 109 (having the same configuration as the semiconductor device 100 according to the embodiment 1) may be disposed on the lines 220 of the circuit board 200 via a conductive bonding material S (for example, solder or the like), the drain electrode 130 and the lines 220 may be electrically connected to each other, and the drain pad DP and the drain electrode 130 may be connected to each other by connecting the lines 220 and the drain pad DP by connecting members such as bonding wires w or the like (see FIG. 21A and FIG. 21B). In this case, in the semiconductor substrate, the drain pad DP and the semiconductor substrate 110 may not be connected to each other by metal plugs Pg for connecting the drain pad DP and the drain electrode 130.

(7) In the above-mentioned respective embodiments, the drain pad is formed. However, the present invention is not limited to such a configuration. That is, the drain pad may not be formed.

(8) In the above-mentioned respective embodiments, a first conductive type is an n-type and a second conductive type is a p-type. However, the present invention is not limited to such a configuration. That is, the first conductive type may be a p-type, and a second conductive type may be an n-type.

What is claimed is:

1. A semiconductor device comprising:
a semiconductor substrate having a drift layer of a first conductive type, a base region of a second conductive type formed on a surface of the drift layer, and a source region of the first conductive type formed on a surface of the base region;
a source electrode formed on a surface of the semiconductor substrate on one side;
a drain electrode formed on a surface of the semiconductor substrate on the other side;
a plurality of trenches formed on the surface of the semiconductor substrate on said one side and each having a bottom disposed adjacently to the drift layer, and side walls disposed adjacently to the drift layer, the base region and the source region;
a plurality of first electrodes each disposed in each of the plurality of trenches by way of a gate insulation film formed on the respective side walls of each of the plurality of trenches, a side surface of each of the plurality of first electrode facing the base region;
a plurality of second electrodes formed above the respective first electrodes in a state where the plurality of second electrodes are spaced apart from the first electrodes;
a plurality of first insulation regions, each of the plurality of first insulation regions being formed between the bottom of the trench and the first electrode so as to make the first electrode spaced apart from the bottom of the trench; and
a plurality of second insulation regions, each of the plurality of second insulation regions expanding between the second electrode and the first electrode so as to make the second electrode spaced apart from the first electrode, and expanding between the second electrode and the side wall of the trench so as to make the second electrode spaced apart from the side walls of the trench, wherein
the trenches, the first electrodes and the second electrodes are formed in stripes as viewed in a plan view, and
at least one of the plurality of the second electrodes is connected to the drain electrode.

2. The semiconductor device according to claim 1, wherein the second electrode is disposed in the trench.

3. The semiconductor device according to claim 2, wherein the second electrode is disposed at a position facing at least one of the source region and the base region in a state where the second insulation region is sandwiched between the second electrode and at least one of the source region and the base region.

4. The semiconductor device according to claim 2, wherein a thickness of the second insulation region between the side wall of the trench and the second electrode is larger than a thickness of the gate insulation film.

5. The semiconductor device according to claim 1, wherein at least a portion of the second electrode is disposed above a height position of the surface of the semiconductor substrate on one side on which the trenches are not formed.

6. The semiconductor device according to claim 1, wherein a shield electrode is disposed in the trench, the shield electrode being disposed between the first electrode and the bottom of the trench, the shield electrode being spaced apart from the bottom of the trench, the side walls of the trench and the first electrode, and the shield electrode being electrically connected to the source electrode or the first electrode.

7. The semiconductor device according to claim 1, wherein
the semiconductor substrate further has a plurality of column regions of the second conductive type formed at a predetermined interval in a region deeper than a bottom of the base region, the drift layer formed between the column regions of the second conductive type disposed adjacently to each other forms a column region of the first conductive type, and a super junction structure is formed of the column region of the first conductive type and the column region of the second conductive type.

8. The semiconductor device according to claim 1, wherein the second electrode is made of polysilicon containing a dopant at predetermined concentration.

9. The semiconductor device according to claim 1, wherein a depth position of a lower surface of the second electrode is shallower than a depth position of a lowermost portion of a contact surface between the source region and the trench.

10. A method of manufacturing a semiconductor device for manufacturing the semiconductor device according to claim 1, the method of manufacturing the semiconductor device comprising in a following order:

a semiconductor substrate preparation step in which the semiconductor substrate having the drift layer of the first conductive type is prepared;

a trench forming step in which the plurality of trenches in stripe shapes as viewed in a plan view are formed;

a first insulation film forming step in which each of the plurality of first insulation regions is formed on the bottom of each of the plurality of the trenches by forming the first insulation film on the bottom and the side walls of each of the plurality of trenches, and forming the gate insulation film on the side walls of each of the plurality of trenches;

a first electrode forming step in which each of the plurality of first electrodes is formed in each of the plurality of trenches by way of the gate insulation film;

a second insulation film forming step in which each of the second insulation films is formed on a surface of each of the plurality of first insulation films on the side walls of each of the plurality of trenches and on a surface of each of the plurality of first electrodes;

a second electrode forming step in which each of the second electrodes is formed above each of the plurality of first electrodes in a state where each of the plurality of second electrode is spaced apart from each of the plurality of first electrode by way of the plurality of second insulation film; and a source electrode and drain electrode forming step which has a step in which the source electrode is formed on the surface of the semiconductor substrate on the one side, and a step in which the drain electrode is formed on the surface of the semiconductor substrate on the said other side.

* * * * *